US011475947B1

(12) United States Patent
Fantini et al.

(10) Patent No.: US 11,475,947 B1
(45) Date of Patent: Oct. 18, 2022

(54) DECODING ARCHITECTURE FOR MEMORY TILES

(71) Applicant: Micron Technology, Inc., Boise, ID (US)

(72) Inventors: Paolo Fantini, Vimercate (IT); Andrea Martinelli, Bergamo (IT); Claudio Nava, Cornate d'Adda (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/231,668

(22) Filed: Apr. 15, 2021

(51) Int. Cl.
| | |
|---|---|
| G11C 16/04 | (2006.01) |
| G11C 13/00 | (2006.01) |
| H01L 27/24 | (2006.01) |
| H01L 45/00 | (2006.01) |

(52) U.S. Cl.
CPC ...... G11C 13/0028 (2013.01); G11C 13/0004 (2013.01); G11C 13/004 (2013.01); H01L 27/249 (2013.01); H01L 27/2454 (2013.01); H01L 45/06 (2013.01); G11C 2213/75 (2013.01)

(58) Field of Classification Search
CPC ............ G11C 13/0028; G11C 13/0004; G11C 13/004; G11C 2213/75; G11C 16/04
See application file for complete search history.

(56) References Cited

U.S. PATENT DOCUMENTS

| | | |
|---|---|---|
| 8,289,763 B2 | 10/2012 | Liu |
| 8,488,374 B2 | 7/2013 | Liu |
| 8,891,280 B2 | 11/2014 | Castro et al. |
| 9,406,362 B2 | 8/2016 | Castro et al. |
| 9,412,421 B2 | 8/2016 | Liu |
| 9,792,958 B1 | 10/2017 | Laurent |
| 10,074,693 B2 | 9/2018 | Castro |
| 10,347,333 B2 | 7/2019 | Laurent |
| 10,818,324 B2 | 10/2020 | Castro et al. |
| 2014/0112074 A1* | 4/2014 | Rhie ............... G11C 16/14 365/185.11 |

(Continued)

FOREIGN PATENT DOCUMENTS

KR 10-2017-0138616 A 12/2017

OTHER PUBLICATIONS

PCT Application No. PCT/IB2019/001256 by Fantini et al., entitled "Vertical 3D Memory Device and Method for Manufacturing the Same", as filed on Dec. 18, 2019 (60 pages).

(Continued)

*Primary Examiner* — Hien N Nguyen
(74) *Attorney, Agent, or Firm* — Holland & Hart LLP

(57) ABSTRACT

Methods, systems, and devices for decoding architecture for memory tiles are described. Word line tiles of a memory array may each include multiple word line plates, which may each include a sheet of conductive material that includes a first portion extending in a first direction within a plane along with multiple fingers extending in a second direction within the plane. A pillar tile may include one or more pillars that extend vertically between the word line plate fingers. Memory cells may each be couple with a respective word line plate finger and a respective pillar. Word line decoding circuitry, pillar decoding circuitry, or both, may be located beneath the memory array and in some cases may be shared between adjacent pillar tiles.

25 Claims, 11 Drawing Sheets

(56) References Cited

U.S. PATENT DOCUMENTS

| | | | |
|---|---|---|---|
| 2014/0239512 A1* | 8/2014 | Pellizzer | H01L 27/2463 |
| | | | 257/776 |
| 2016/0163367 A1 | 6/2016 | Song | |
| 2016/0232973 A1* | 8/2016 | Jung | G11C 16/0483 |
| 2020/0066744 A1* | 2/2020 | Yun | G11C 13/0004 |
| 2020/0152650 A1 | 5/2020 | Thimmegowda et al. | |
| 2020/0278923 A1 | 9/2020 | Jacob et al. | |
| 2020/0350203 A1 | 11/2020 | Fratin et al. | |
| 2020/0388315 A1 | 12/2020 | Bedeschi | |

OTHER PUBLICATIONS

PCT Application No. PCT/IB2020/020078, by Micron Technology, Inc., entitled "Memory Apparatus and Methods for Accessing and Manufacturing the Same", filed Dec. 9, 2020 (55 pages).

PCT Application No. PCT/IB2020/020036, by Micron Technology, Inc., entitled "3D Quilt Memory Array for FERAM and DRAM", filed Jul. 14, 2020 (47 pages).

"International Search Report and Written Opinion of the International Searching Authority," issued in connection with Int'l Appl. No. PCT/US2022/071623, dated Jul. 20, 2022 (11 pages).

\* cited by examiner

```
                    ┌─────────────────────────────────────┐
                    │ Applying, using first decoding      │
                    │ circuitry, a first voltage to       │
                    │ a first word line plate of a first  │
                    │ word line tile that is              │
                    │ associated with a first pillar tile,│
                    │ the first word line plate           │
                    │ including a set of first word lines │
                    │ each coupled with one               │
                    │ or more respective memory cells of  │ ─── 1105
                    │ a set of first memory               │
                    │ cells, wherein the first pillar tile│
                    │ includes a set of first             │
                    │ pillars each coupled with one or    │
                    │ more respective first               │
                    │ memory cells of the set of first    │
                    │ memory cells                        │
                    └─────────────────────────────────────┘
                                     │
                                     ▼
                    ┌─────────────────────────────────────┐
                    │ Applying, using the first decoding  │
                    │ circuitry, a second                 │
                    │ voltage to a second word line plate │
                    │ of a second word line               │
                    │ tile that is associated with a      │
                    │ second pillar tile, the second      │
                    │ word line plate including a set of  │
                    │ second word lines each              │
                    │ coupled with one or more respective │
                    │ memory cells of a set               │ ─── 1110
                    │ of second memory cells, wherein the │
                    │ second pillar tile                  │
                    │ includes a set of second pillars    │
                    │ each coupled with one or            │
                    │ more respective second memory cells │
                    │ of the set of second                │
                    │ memory cells                        │
                    └─────────────────────────────────────┘
                                     │
                                     ▼
                    ┌─────────────────────────────────────┐
                    │ Applying, using second decoding     │
                    │ circuitry associated                │
                    │ with the first pillar tile, a third │
                    │ voltage to a first pillar of        │
                    │ the set of first pillars included in│
                    │ the first pillar tile, the          │
                    │ first pillar coupled with a first   │
                    │ memory cell of the set of           │ ─── 1115
                    │ first memory cells, wherein the     │
                    │ first memory cell is                │
                    │ operable to be accessed based at    │
                    │ least in part on applying           │
                    │ the first voltage to the first word │
                    │ line plate and applying             │
                    │ the third voltage to the first      │
                    │ pillar                              │
                    └─────────────────────────────────────┘
                                     │
                                     ▼
                    ┌─────────────────────────────────────┐
                    │ Applying, using third decoding      │
                    │ circuitry, a fourth voltage         │
                    │ to a second pillar of the set of    │
                    │ second pillars included in          │
                    │ the second pillar tile, the second  │
                    │ pillar coupled with a               │
                    │ second memory cell of the set of    │
                    │ second memory cells,                │
                    │ wherein the second memory cell is   │ ─── 1120
                    │ operable to be                      │
                    │ accessed based at least in part on  │
                    │ applying the second                 │
                    │ voltage to the second word line     │
                    │ plate and applying the              │
                    │ fourth voltage to the second pillar │
                    └─────────────────────────────────────┘

… # DECODING ARCHITECTURE FOR MEMORY TILES

FIELD OF TECHNOLOGY

The following relates generally to one or more systems for memory and more specifically to various examples of a decoding architecture for memory tiles.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

BRIEF DESCRIPTION OF THE DRAWINGS

FIG. 11 shows a flowchart illustrating a method or methods that support a decoding architecture for memory tiles in accordance with examples as disclosed herein.

DETAILED DESCRIPTION

Figure 1:
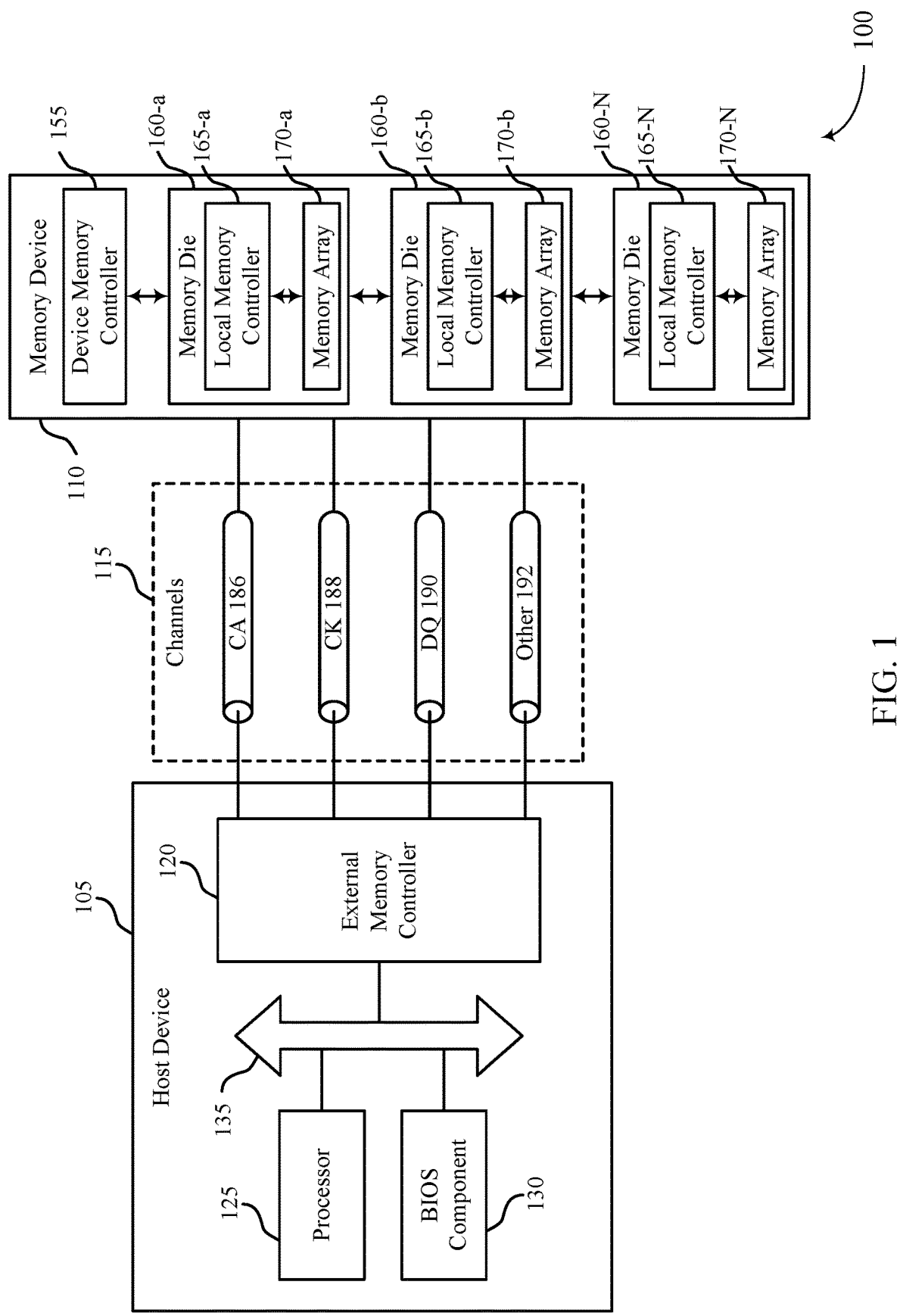
FIG. 1 illustrates an example of a system that supports a decoding architecture for memory tiles in accordance with examples as disclosed herein.

Word line plates of a memory array may each include multiple word lines in a "comb" structure (e.g., a structure that may look like a tool with a spine, fingers extending from the spine, and a space between each pair of adjoining fingers). A word line plate may, for example, include a sheet of conductive material that includes a first portion extending in a first direction within a plane, and multiple fingers extending in a second direction within the plane. Each finger of a word line plate may represent a word line as described herein, though the word lines (e.g., fingers) of a same word line plate may be electrically coupled with one another by the spine of the comb and thus may be activated or deactivated together. A word line plate may be activated to access corresponding memory cells of the memory array (e.g., memory cells coupled with a finger of the word line plate).

Word line plates and corresponding memory cells may be vertically stacked above or below one or more other word line plates and corresponding memory cells to form tiers of the memory array. A stack of word line plates may be coupled with an electrode structure (e.g., a staircase as described elsewhere herein), via which a word line decoder may be operable to apply a voltage to any selected word line plate of the stack of word line plates, to support accessing one or more memory cells coupled with a selected word line plate. The word line decoder for a stack of word line plates may include one or more word line drivers each configured to selectively activate or deactivate a corresponding word line plate in the stack (e.g., a word line plate coupled with the word line driver). The word line decoding circuitry may be located below the memory cells and word line plates of the memory array. As used herein, a first set of one or more components described as being "below" (or alternatively "under") a second set of one or more components may refer to the first set of one or more components being located between the second set of one or more components and a substrate (e.g., upon which both the first set of one or more components and second set of one or more components are formed) and within a footprint of the second set of one or more components. Circuitry that is below a memory array may be referred to as circuitry-under-array (CuA) or alternatively as within a CuA area.

In some cases, two or more word line plates in a same plane (e.g., word line plates within different vertical stacks of word line plates but at a same tier or level) may share an electrode and a corresponding driver for activating the word line plates. Such sharing may beneficially reduce a footprint of supporting circuitry for operating a memory array (e.g., an area of decoders and drivers within the CuA may be reduced), for example, among other possible benefits. Memory cells coupled with the word line plates sharing the electrode and driver may be (or alternatively include) a page for accessing memory cells (e.g., a logical page for accessing memory cells of the memory array). In some cases, a group of electrodes coupled with different word line plates at different levels or planes of a stack may be referred to as a staircase. A word line decoder may be operable to activate any electrode of the group of electrodes to concurrently activate two or more respective word line plates in a same plane but different vertical stacks.

A memory cell may be accessed via a first voltage applied to a word line plate coupled with the memory cell and a second voltage applied to a pillar (e.g., an electrode that extends vertically between word line plate fingers) that is also coupled with the memory cell. A pillar tile may represent a portion of pillars within a memory array that may be accessed using the same set of complementary pillar decoders, such as a set of one X-direction pillar decoder to decode pillar access lines that extend in the Y direction and one Y-direction pillar decoder to decode pillar access lines that extend in the X direction. The pillar access lines that extend in the X and Y directions may respectively be referred to as pillar row lines and pillar column lines, and a pillar selector (e.g., for activating a pillar of the tile) at the intersection of a pillar row line and pillar column line may be operable to be activated based on activating the pillar row and pillar column line.

In some cases, a pillar tile may be associated with multiple word line tiles (e.g., each word line tile may include some quantity of word line plates, such as one or two word line plates). Associating a pillar tile with multiple word line tiles (e.g., such that the pillar tile is larger than the word line tiles and includes memory cells within multiple word line tiles) may reduce a footprint of decoding circuitry for a memory array, for example, by resulting in one set of complementary pillar decoders for all of the pillars of the pillar tile (e.g., as opposed to one set of complementary pillar decoders for each word line tile), a set of word line decoders for all of the word line plates (e.g., tiers of word line plates) of the pillar tile, or both.

As described herein, the pillar decoding circuitry and word line decoding circuitry for a memory array may be located under the memory array (e.g., in the CuA), with at least a portion of the pillar decoding circuitry, word line decoding circuitry, or both for a pillar tile located under the pillar tile. In some cases, pillar decoding circuitry, word line decoding circuitry, or both, may be shared by multiple pillar tiles (e.g., a word line decoder may be coupled with word line plates within two adjacent pillar tiles, or a pillar decoder may be coupled with pillar access lines included within two adjacent pillar tiles, or both), with the shared circuitry located under the pillar tiles for which it is shared. Sharing of word line decoding circuitry across pillar tiles likewise may reduce a footprint of decoding circuitry for a memory array, as the number of word line decoders per pillar tile may be reduced (e.g., by half).

For these or other reasons, decoding structures and configurations as described herein may support a reduced area or footprint occupied by decoding circuitry for accessing the memory cells (e.g., compared to some other memory array structures). The reduction in the area occupied by the decoding circuitry may, for example, decrease overall device footprint (e.g., by allowing all decoding circuitry for the memory array to be located under the memory array, as opposed to at least partially occupying some peripheral area), allowing more memory cells to be included within a device of a given footprint, or both. Further, a memory array as described herein may support parallel or concurrent (e.g., at least partially simultaneous) access operations for two or more memory cells within a same page of memory cells. For example, memory cells coupled with different word lines and respectively associated with a left-facing word line plate (e.g., with fingers extending to the left), a right-hand word line plate (e.g., with fingers extending to the right), or both may be accessed in parallel, which may increase access operation speed, data throughput, or both. These and other benefits described herein are merely exemplary, and one of ordinary skill in the art may appreciate further benefits.

Features of the disclosure are initially described in the context of memory systems, dies, and arrays as described with reference to FIGS. 1-3. Features of the disclosure are further described in the context of memory arrays and array architectures along with various components thereof or associated therewith, as described with reference to FIGS. 4-9. These and other features of the disclosure are further illustrated by and described with reference to apparatus diagrams and flowcharts that relate to a decoding architecture for memory tiles as described with references to FIGS. 10-11.

FIG. 1 illustrates an example of a system 100 that supports a decoding architecture for memory tiles in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

A memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some examples, multiple decks, levels, or layers of memory cells (e.g., stacked vertically) may be considered a single 3D memory array 170 (e.g., as opposed to a stack of multiple memory arrays 170).

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory array as described herein may include any quantity of word line tiles, where each word line tile includes one or more vertical stacks of word line plates (e.g., one or more vertical stacks of combs). The word line plates within a vertical stack may be able to be independently activated or deactivated by associated word line decoding circuitry. Pillars may extend vertically between the fingers of the word line plates (which may extend horizontally), and each memory cell of the memory array may be coupled with a corresponding word line (e.g., a corresponding finger of a corresponding word line plate) and a corresponding pillar. Each pillar may be able to be independently activated or deactivated using one or more pillar access lines (e.g., based on the one or more pillar access lines for a pillar being coupled with a respective pillar selector for the pillar). A pillar tile may include a set of pillars that are able to be decoded (e.g., independently activated or deactivated) using a same set of pillar decoding circuitry, which may be or include a pair of complementary pillar decoders for the pillar tile (e.g., an X-direction pillar decoder for the pillar tile and a Y-direction pillar decoder for the pillar tile, where each pillar is activated or deactivated via a respective Y-direction pillar access line and a respective X-direction pillar access line). A pillar tile may in some cases include multiple word line tiles (e.g., for the pillars within a pillar tile, the memory cells coupled with the pillars may in turn be coupled with word lines included in multiple word line tiles).

Word line and pillar decoding circuitry for the word line tiles and pillar tiles within a memory array may be located under the memory array (e.g., within a footprint of the memory array, above a substrate upon which the memory array is formed or). For example, pillar decoding circuitry for a pillar tile may be located under (e.g., within a footprint of) the pillar tile. Additionally or alternatively, pillar decoding circuitry, word line decoding circuitry, or both, may be shared across pillar tiles and located under those pillar tiles. Additional circuitry may in some cases also be located under pillar tiles as described herein, such as sense amplifiers, for example. Decoding structures and configurations as described herein may beneficially support a reduced area occupied by decoding circuitry or other circuitry associated with operating the memory cells of the memory array (e.g., compared to other memory array configurations) and in some cases may allow all support circuitry for a memory array to be located under the memory array (e.g., as CuA).

Figure 2:
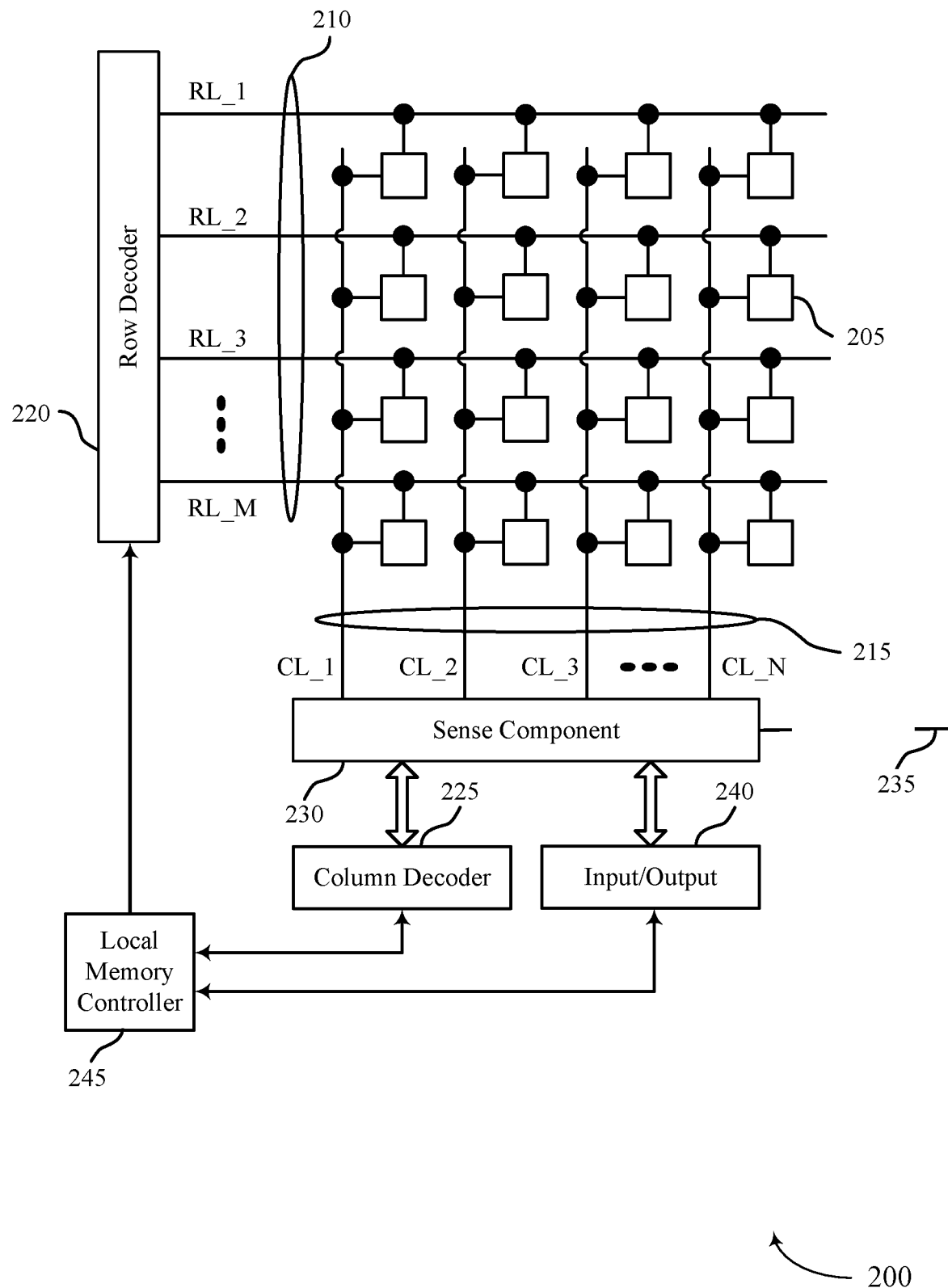
FIG. 2 illustrates an example of a memory die that supports a decoding architecture for memory tiles in accordance with examples as disclosed herein.

FIG. 2 illustrates an example of a memory die 200 that supports a decoding architecture for memory tiles in accordance with examples as disclosed herein. The memory die 200 may be an example of a memory die 160 as described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

FIG. 2 may illustrate various features related to the electrical operation of a memory array, but the physical location and configuration of components may deviate from the depiction in FIG. 2. For example, the features illustrated by FIG. 2 may be representative of memory cells 205 being located at an intersection of respective access lines (e.g., row lines 210 and column lines 215), may be representative of the electrical function of memory cells and other array components, or both, but a memory array may in some cases have a different physical architecture or structure relative to that illustrated by FIG. 2 (e.g., as described below with reference to FIGS. 3-9).

In some cases, a memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include access lines (e.g., row lines 210 and column lines 215). Access lines may be formed of one or more conductive materials. In some examples, row lines 210 may be referred to as word lines. In some examples, column lines 215 may be referred to as digit lines or bit lines. In some cases, additional types of access lines may be present as described elsewhere herein. References to access lines, row lines, column lines, word lines, digit lines, or bit lines, or their analogues, are interchangeable without loss of understanding or operation. Memory cells 205 may be positioned, for example, at intersections of the row lines 210 (e.g., fingers of a word line plate) and the column lines 215 (e.g., pillars or other vertical electrode structures).

In some cases, one or more column lines 215 (e.g., a column line CL_j) may run perpendicularly to a substrate and one or more row lines 210 (e.g., a row line RL_i) may be on a different deck than illustrated (e.g., each row line 210 may be a word line finger of a word line plate stacked in a vertical direction). In such cases, a memory cell 205 may be formed at an intersection of the column line CL_j and the row line RL_i (e.g., between a pillar and a word line finger of a stacked word line plate). One or more other memory cells 205 may be coupled between one or more other row lines 210 (not pictured in FIG. 2) of one or more other stacked word line plates (not pictured in FIG. 2) and the column line CL_j, as well as between one or more other row lines 210 (not pictured in FIG. 2) and one or more other column lines 215 (e.g., pillars, not depicted).

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address. In some cases, functions ascribed herein to column decoder 225 may be performed by one or more pillar decoders, such as complementary X-direction and Y-direction pillar decoders configured to decode among the pillars of a pillar tile.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of a local memory controller 165 as described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address (e.g., pillar address) signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state. The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

Word line plates or a finger thereof as described herein may electrically correspond to a row line 210 or column line 215, but word line plates may be configured as a "comb"

structure (e.g., a structure that may look like a tool with multiple fingers extending from a common spine and a space between each pair of adjoining fingers). A word line plate may be coupled with a word line decoder (e.g., row decoder 220) via an electrode that may be operable to apply a voltage to the word line plate for accessing associated memory cells. The word line decoder may be operable to independently activate or deactivate individual word line plates within a vertical stack of word line plates. In order to reduce a footprint of supporting circuitry for a memory device (e.g., word line decoding circuitry), two word line plates in a same plane (e.g., in different vertical stacks but at the same level within the stacks) may share an electrode for activating the word line plates. The two word line plates sharing the electrode may be (or alternatively include) a page for accessing memory cells 205 (e.g., a logical page for accessing memory cells).

A memory cell 205 may be accessed via a first voltage applied to a word line plate coupled with the memory cell 205 and a second voltage applied to a pillar (e.g., a vertical electrode structure electrically isolated from the word line plate) coupled with the memory cell 205. In some cases, a column line 215 or row line 210 as described with reference to FIG. 2 may correspond to a pillar as described herein. A pillar tile may be associated with multiple word line tiles (e.g., each word line tile representing one or two word line plates, or one or two vertical stacks thereof), where a pillar tile may represent a portion of pillars within a memory array that may be accessed using one set of complementary decoders, such as a set of one X-direction pillar decoder and one Y-direction pillar decoder, where the X and Y directions may respectively correspond to access lines coupled with pillar selectors, and which may be described in greater detail elsewhere herein. In some examples, decoding circuitry including pillar decoders, word line decoders, or both, may be located under a memory array as CuA, possibly along with other support circuitry for operating the memory array, such as a sense component 230 or at least sense amplifiers thereof. Additionally or alternatively, word line decoders, pillar decoders, or both may in some cases be shared across adjacent pillar tiles, which may reduce a footprint of supporting circuitry (e.g., decoding circuitry) for the memory device.

Figure 3:
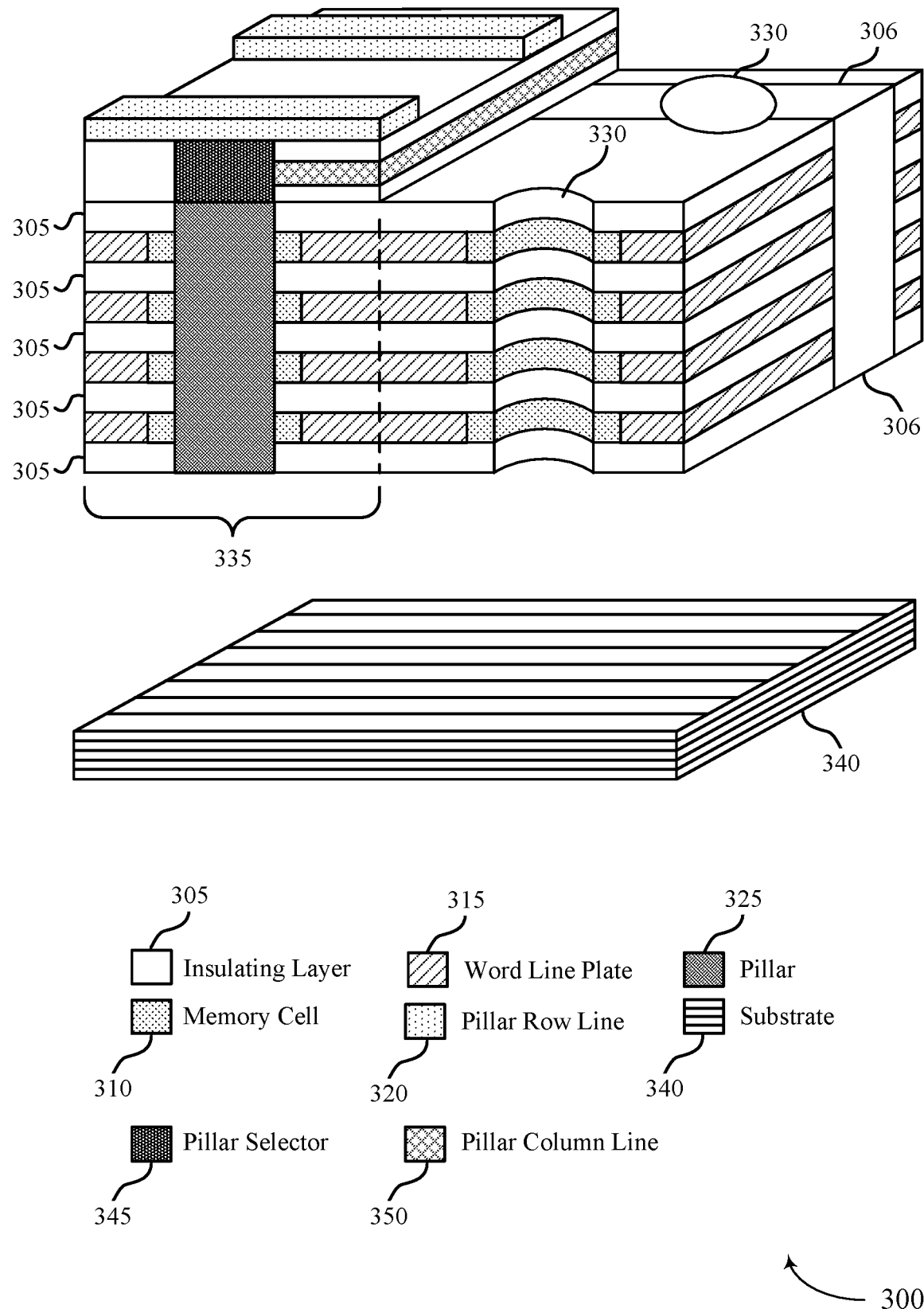
FIG. 3 illustrates aspects of an example of a memory array that supports a decoding architecture for memory tiles in accordance with examples as disclosed herein.

FIG. 3 illustrates an example portion of a memory array 300 that supports a decoding architecture for memory tiles in accordance with examples as disclosed herein. Memory array 300 may be an example of a memory array described with reference to FIGS. 1 and 2. Memory array 300 may include multiple levels of memory cells 310 stacked in a vertical direction, relative to a substrate 340, to create memory cell stacks 335, which may be examples of a memory cell and memory cell stack as described with reference to FIGS. 1 and 2. Memory array 300 may thus be referred to, in some examples, as a 3D memory array. Memory array 300 may include word line plates 315 and pillars 325, which may electrically function as examples of word lines and bit lines (e.g., row lines 210 and column lines 215) as described with reference to FIG. 2.

A word line plate 315 may include multiple word lines in a "comb" structure (e.g., a structure that may look like a tool with multiple fingers extending from a common spine and a space between each pair of adjoining fingers). The word line plate 315 may, for example, include a sheet of conductive material that includes a first portion (e.g., a spine) extending in a first direction within a plane, and multiple fingers extending in a second direction within the plane. Each word line plate 315 or finger thereof may represent a word line as described herein. A quantity of fingers (e.g., word lines) and a length of the fingers may define a size of a word line plate 315, where the size of the word line plate may be based on a capacitance of the word line plate 315 in relation to one or more storage class memory (SCM) specifications. Various exemplary details of the comb structure, fingers, and other aspects of a word line plate 315 may be further illustrated or described elsewhere herein.

Each pillar 325 may each be selectively couplable with a respective pillar row line 320 via a pillar selector 345 (e.g., a transistor or a switching component). For example, a pillar column line 350 for a pillar 325 may be coupled with the pillar selector 345 for the pillar 325, and based on the voltage of the pillar column line 350 (e.g., a voltage differential between the voltage of the pillar column line 350 and the voltage of the pillar row line 320), the pillar selector 345 may be selectively activated or deactivated. When activated (e.g., on, closed, conducting), the pillar selector 345 for a pillar 325 may couple the pillar 325 with the pillar row line 320 for the pillar 325, and thus the voltage of the pillar 325 may become equal or approximately equal to the voltage of the pillar row line 320. In some cases, a pillar selector 345 may be a transistor (e.g., a thin-film transistor (TFT) or other type of transistor), and a gate of the transistor may be couple with the pillar column line 350, a source of the transistor may be coupled with the pillar row line 320, and a drain of the transistor may be coupled with the pillar 325. Hence, in some cases, a pillar column line 350 may alternatively be referred to as a pillar gate line, and a pillar row line 320 may alternatively be referred to as a pillar source line.

A pillar decoder as described herein may be operable to selectively activate (e.g., apply a selection voltage to) or deactivate (e.g., apply a deselection voltage to) a pillar column line 350 out of a set of pillar column lines 350 associated with the pillar decoder, or to selectively activate (e.g., apply a selection voltage) or deactivate (e.g., apply a deselection voltage) to a pillar row line 320 out of a set of pillar row lines 320 associated with the pillar decoder. Though FIG. 3 illustrates an example in which pillar selectors 345, pillar row lines 320, and pillar column lines 350 are above the pillars 325, it is to be understood that pillar selectors 345, pillar row lines 320, and pillar column lines 350 may alternatively be located below the pillars 325 (e.g., with a respective pillar selector 345 coupled with the bottom of each pillar 325).

Pillar column lines 350 and pillar row lines 320 may span and thus be coupled with the pillar selectors 345 corresponding to rows or columns of pillars 325 coupled with memory cells that are in turn coupled with a single word line plate, word line plates within a single word line tile, or word line plates within multiple word line tiles as described herein. One of ordinary skill in the art will appreciate that what direction (e.g., the X or Y direction) is considered a row versus a column may be arbitrary. In some cases, a pillar 325 may correspond (e.g., in terms of one or more functionalities) to a column line 215 as described with reference to FIG. 2. Similarly, pillar decoders, pillar column lines 350, pillar row lines 320, and pillar selectors 345 may correspond (e.g., in terms of one or more functionalities) to a column decoder 225 as described with reference to FIG. 2.

In some cases, pillars 325 coupled with the same pillar column line 350 may be considered as a comb structure with vertical comb fingers (e.g., the pillars 325) that are selectable (e.g., individually relative to other pillars 325 coupled with the same pillar column line 350) via respective pillar row lines 320, and each memory cell 310 may be located at the intersection of a horizontal finger of a word line plate 315

(e.g., a word line) and a vertical finger (e.g., a pillar 325, which may be considered a digit line or a portion of a digit line), though the teachings herein are not limited to such conceptualizations.

Memory array 300 may also include insulating layers 305, trench insulating layers 306, vias 330, and substrate 340. While the example of FIG. 3 illustrates pillar row lines 320 and pillar column lines 350 as above the pillars 325, pillar row lines 320 and pillar column lines 350 may alternatively be below the pillars 325 (e.g., between the pillars 325 and the substrate 340) in some implementations.

Insulating layers 305 may be electrically insulating and may provide insulation between alternating word line plates 315. As described herein, various logic states may be stored by programming the electrical resistance of memory cells 310. In some cases, programming the electrical resistance includes passing a current through memory cell 310, heating memory cell 310, melting the material of memory cell 310 (e.g., wholly or partially), applying a voltage of a particular polarity to the memory cell, or any combination thereof. Insulating layers 305 may be composed of multiple sublayers, creating one or more interfaces between memory cells 310.

Memory array 300 may include an array of memory cell stacks 335, and each memory cell stack 335 may include multiple memory cells 310. Memory array 300 may be made by forming a stack of conductive layers, such as word line plates 315, where each conductive layer may be separated from an adjacent conductive layer by one or more electrically insulating layers 305. The electrically insulating layers may include oxide or nitride materials, such as silicon oxide, silicon nitride, or other electrically insulating materials. In some cases, electrically insulating layers 305 may include one or more sublayers. The layers of memory array 300 may be formed on (e.g., above) a substrate 340, such as a silicon wafer, or any other semiconductor or oxide substrate. Vias 330 (e.g., openings) may be formed by removing material from the stack of layers through etching or mechanical techniques, or both. In some cases, CuA as described herein may refer to circuitry that is formed between a substrate 340 and the memory array (e.g., within a footprint of the memory array—which may correspond to or include a footprint of the memory cells 310, word line plates 315, pillars 325, possibly along with related interconnect structures—as opposed to peripheral circuitry that may be formed alongside or otherwise outside the footprint of the memory array). For example, CuA may be formed above the substrate 340, and then the memory array may be formed above the CuA.

Memory cell 310 (e.g., memory elements) may in some cases be formed by removing material from the conductive layer to create a recess adjacent to a via 330, and forming a variable resistance material in the recess. For example, material may be removed from the conductive layer by etching, and the variable resistance material may be deposited in the resulting recess to form a memory cell 310 (e.g., memory element, which may be a storage element). Each via 330 may be filled with electrical conductor materials and a dielectric material to create a pillar 325, which may be coupled (e.g., selectively, such as using the pillar selector 345) to a pillar row line 320. In other words, memory cells 310 in a memory cell stack 335 may share a common electrode (e.g., a pillar 325). Thus, each memory cell 310 may be coupled with a word line plate 315 and a pillar 325. In some cases, each pillar 325 (e.g., within each via 330) may be coupled with a first word line finger via corresponding first memory cells and a second word line finger via corresponding second memory cells, as described in further detail with reference to FIG. 4. Trench insulating layers 306 may be electrically insulating and may provide insulation between alternating (e.g., interdigited) word line fingers of each word line plate 315 (e.g., word line fingers on each side of a via 330 in the direction of the pillar column lines 320, where word line fingers on opposite sides of a trench insulating layer 306 may extend in parallel but opposite directions away from the spines of their respective word line plates, such as with a first word line finger immediately on one side of the trench insulating layer 306 extending to the right and a second word line finger immediately on the opposite side of the trench insulating layer 306 extending to the left).

In some examples, a material of the memory cells 310 (e.g., memory elements) may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In), or a combination thereof, and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms. Other chalcogenide alloys not expressly recited here may also be employed.

In some examples, such as for thresholding memory cells or self-selecting memory cells 310, some or all of a set of logic states supported by the memory cells 310 may be associated with a same state, such as an amorphous state of the chalcogenide material as opposed to a crystalline state of the chalcogenide material (e.g., the material may be operable to store different or multiple logic states while remaining in an amorphous state). In some such examples, a memory cell 310 may be an example of a self-selecting memory cell 310. In such examples, the material used in the memory cell 310 may be based on an alloy (such as the alloys listed above) and may be operated so as to undergo a state change during normal operation of the memory cell (e.g., due to ion migration or segregation within the memory cell 310). For example, a self-selecting memory cell 310 may have a high threshold voltage state and a low threshold voltage state. A high threshold voltage state may correspond to a first logic state (e.g., a reset state) and a low threshold voltage state may correspond to a second logic state (e.g., a set state). In some examples, a memory cell 310 may alterative be switched between an amorphous and crystalline state during operation, which the amorphous and crystalline states corresponding to different resistances or threshold voltages and thus to different logic states, and such operation may in some cases be referred to as phase change operation.

In some cases, during a programming (write) operation of a self-selecting memory cell 310, a polarity of one or more pulses used for a write operation may influence (determine, set, program) a particular behavior or characteristic of the material of the memory cell 310, such as the threshold voltage of the material. The difference in threshold voltages of the material of the memory cell 310 depending on the logic state stored by the material of the memory cell 310 (e.g., the difference between the threshold voltage when the material is storing a logic state '0' versus a logic state '1') may correspond to a read window of the memory cell 310.

Various techniques may be used to form materials or components on a substrate 340. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a variety of techniques, which may include, for example, chemical etching (also referred to as "wet etching"), plasma etching (also referred to as "dry etching"), or chemical-mechanical planarization.

As described herein, regions separating memory cells 310, for example, insulating layers 305, trench insulating layers 306, or both, may include one or more interfaces. In some examples, the interfaces of the insulating layers 305 separate memory cells 310 stacked in the vertical direction. In other words, memory cells 310 may be stacked one on top of the other and separated from one another by the interfaces. In some examples, the interfaces of the trench insulating layers 306 separate word line fingers from one another in a horizontal direction.

The memory cells 310 described herein may include, but not be limited to, phase change materials. Other types of memory cells 310 may include, for example, resistive memory or resistive RAM. In some cases, resistive RAM may use metal oxide materials whose electrical resistance is varied by controlling the ionic state of atoms in the material or by controlling the quantity or location of atomic vacancies (e.g., missing atoms) in the material.

Figure 4A:
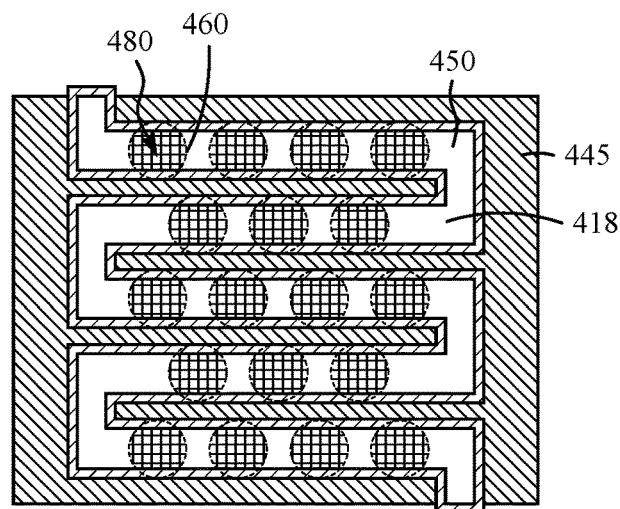
FIGS. 4A and 4B illustrate aspects of examples of memory arrays that support a decoding architecture for memory tiles in accordance with examples as disclosed herein.
Figure 4B:
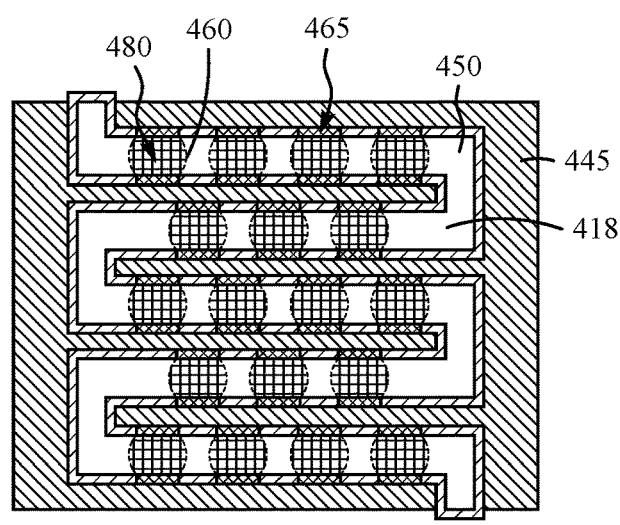

FIGS. 4A and 4B illustrate examples of memory arrays 400-a and 400-b that support a decoding architecture for memory tiles in accordance with examples as disclosed herein. For example, FIGS. 4A and 4B illustrate various views (e.g. top-down views) of cross-sections of example 3D memory arrays 400-a and 400-b, which may be examples of 3D memory arrays in accordance with examples as disclosed herein. Multiple openings 460 may be formed through the alternating planes of a conductive material 445 (e.g., word lines planes or word line plates), a dielectric material 418, and a second dielectric material, for example, in a trench 450. As shown, the diameter of the multiple openings 460 may be approximately the same width of the trench 450. In some examples, the diameter of the multiple openings 460 may be greater than the width of the trench 450.

Each of the multiple openings 460 may be approximately concentric with a different respective conductive contact. As shown in FIGS. 4A and 4B, a pillar 480 (e.g., circular pillar 480) may be formed in each respective opening 460 in a geometric pattern, for example, formed over and coupled with a respective conductive contact (e.g., which may be or be coupled with a pillar selector 345). In some examples, the openings 460 (e.g., and corresponding pillars 480) may be square or another shape. In some cases, the multiple openings 460 may have a staggered (e.g., hexagonal) arrangement of conductive contacts associated with the pillars 480. For example, a respective conductive contact may be surrounded by six other conductive contacts.

A staggered pattern may refer to any pattern where positions of objects (e.g., contacts, openings 460, or pillars 480) in a first row are offset from positions of objects (e.g., contacts, openings 460, or pillars 480) in a second row adjacent to the first row in a given direction. For example, a staggered pattern may have objects (e.g., contacts, openings 460, or pillars 480) adjacent to one another in the x-direction (e.g., rows or a horizontal direction), but not in the y-direction (e.g., columns or a vertical direction). For instance, as illustrated in FIGS. 4A and 4B, conductive contacts may be adjacent to each other and in line with each other in an x-direction. However, the conductive contacts may not be adjacent to each other in the y-direction and may, for example, alternate (e.g., skip) rows in the y-direction. Although FIGS. 4A and 4B show spacing that is approximately the same between the conductive contacts throughout a substrate, examples in accordance with the present disclosure are not limited to such. For example, the spacing between the conductive contacts may vary throughout the substrate.

FIG. 4B shows that the 3D memory array may include multiple storage element materials 465, each including a chalcogenide material or other storage element positioned between at least one word line plate, at least one pillar 480, and at least one dielectric material 418. In some examples (e.g., depending on the decoding optimization), each pillar 480 may be coupled with a respective pillar selector (e.g., a switching element, such as a transistor) positioned at a top, a bottom, or both a top and a bottom (e.g., below or above a set of word line plates) of the 3D memory array 400.

Figure 5A:
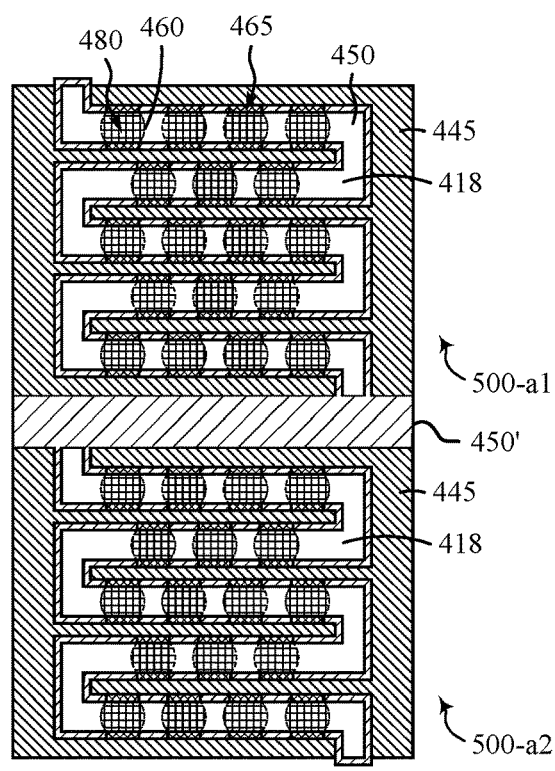
FIGS. 5A, 5B, and 5C illustrate aspects of examples of memory arrays that support a decoding architecture for memory tiles in accordance with examples as disclosed herein.
Figure 5B:
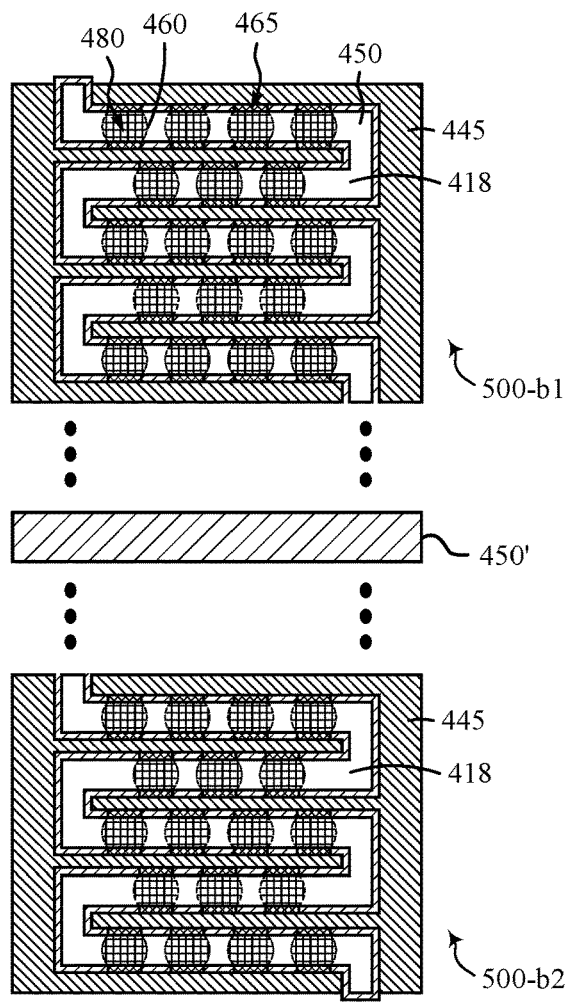
Figure 5C:
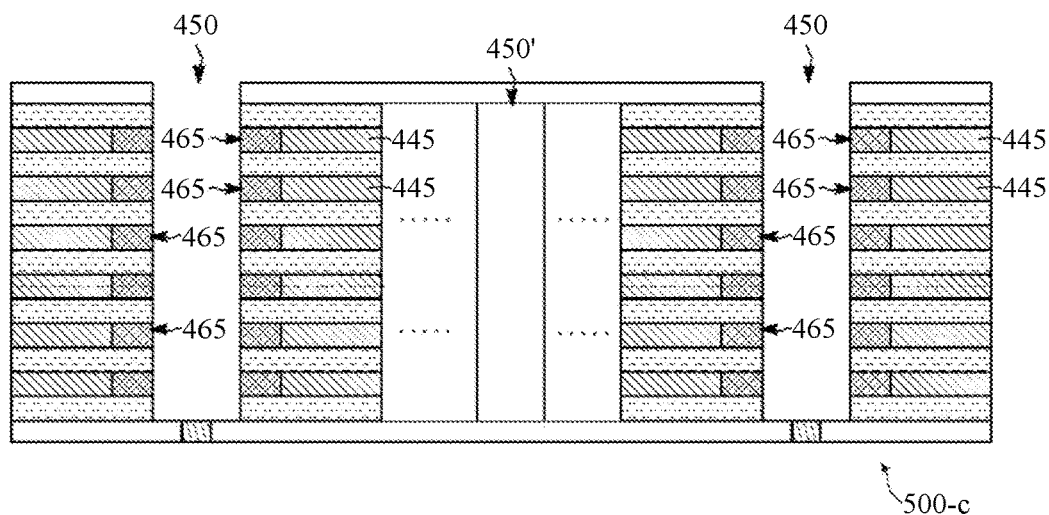

FIGS. 5A, 5B, and 5C illustrate examples of memory arrays 500-a, 500-b, and 500-c that support a decoding architecture for memory tiles in accordance with examples as disclosed herein. For example, FIGS. 5A, 5B, and 5C may illustrate various views of cross-sections of example 3D memory arrays 500-a, 500-b, and 500-c, which may be examples of 3D memory arrays in accordance with examples as disclosed herein, with FIGS. 5A and 5B being top-down views and FIG. 5C being a side view. The memory arrays 500-a, 500-b, and 500-c may include similar features to a memory array 400 described with reference to FIGS. 4A and 4B. A particular separation trench 450', which may be filled with an insulation material or a dielectric material, may be formed between two sub-arrays (e.g., a first sub-array 500-a1 and a second sub-array 500-a2), such that the first sub-array 500-a1 and the second sub-array 500-a2 may be isolated from each other electrically. In some examples, the memory array 500-a may include a set of vertically stacked word line plates separated from one another with respective dielectric layers (refer to the side view of the memory array shown in FIG. 5C).

Word line plates may be formed by conductive material 445 of memory arrays 500-a, 500-b, and 500-c. In the first sub-array 500-a1, a first word line plate (e.g., of a first stack of word line plates) may be isolated from a second word line plate in the same plane (e.g., of a second stack of word line plates) using a dielectric material extending in a serpentine shape (e.g., a shape of a trench 450). In the second sub-array 500-a2, a third word line plate (e.g., of a third stack of word line plates) may similarly be isolated from a fourth word line plate in the same plane (e.g., of a fourth stack of word line plates) using a dielectric material extending in a serpentine shape (e.g., a shape of a trench 450). The first word line plate and the second word line plate may be isolated from the third word line plate and the fourth word line plate by the separation trench 450'. One separation trench 450' is illustrated in FIGS. 5A through 5C, which is for illustration purposes. The quantities of the separation trenches 450' and the sub-arrays 500-a1 and 500-a2 may not be limited to the quantities illustrated in FIGS. 5A through 5C. For example, multiple separation trenches 450' may be formed in a 3D memory array as desired (e.g., to isolate various sub-arrays of the 3D memory array).

With the separation trench 450' filled with an insulation material or a dielectric material, which may also be referred to as a separation layer, a power consumption of a 3D memory array may be reduced while meeting an SCM specification. For example, compared to a 3D memory array in which multiple sub-arrays are coupled with each other, a 3D memory array with serval separation layers interposed may experience a corresponding drop in a capacitance value of the memory array (e.g., of the individual sub-arrays) and the power consumption may also be further reduced without increasing a decoding burden.

As shown in FIG. 5A, in some examples, after forming the trench 450 in a serpentine shape in the 3D memory array 500-a, a portion of the trench 450 may be selected as the separation trench 450', which may be used to divide the 3D memory array 500-a into the first sub-array 500-a1 and the second sub-array 500-a2. For example, the separation trench 450' may be subjected to a further etch operation such that the two sub-arrays on both sides of the particular separation trench 450' may be separated, which may sever one or more word line plate structures to create separate word line plates or sets (e.g., stacks) of word line plates on either side of the separation trench 450'. In some examples, during the subsequent processing steps, the separation trench 450' may be filled with an insulative material or dielectric material, for example, without any other material such as a storage element material or a conductive material formed therein. In some examples, a portion from the serpentine trench 450 may be used as the separation trench 450' between different sets of word line plate fingers (e.g., every X fingers, where X is some quantity).

In another example, a set of sub-arrays may be formed above a same substrate and a separation layer 450' may be deposited on one or both sides of each sub-array in the horizontal direction of the serpentine shaped trench 450, such that the set of sub-arrays may be isolated from each other electrically. In another example, after forming a 3D memory array and based on one or more dimensions of the 3D memory array, a quantity of separation trenches 450' may be formed to cut the 3D memory array into a set of sub-arrays, where an etch operation may be performed on the memory array to form the separation trenches 450'.

A position where a separation trench 450' (or a separation layer 450') is formed may be adjusted according to the dimension of 3D memory array, to achieve a desired dimension of a sub-array, or both, as illustrated by FIGS. 5B and 5C. In some examples, the 3D memory array may be formed based on example pitches of adjacent pillars.

In some examples, insertion of the separation layers 450' may aid in the corresponding capacitance value being sufficiently low that the word line may be biased by a driver consuming a desirably low amount of energy (e.g., a first order computation of the energy to drive the word line may in some cases be (½ $CV^2$)). Additionally, dividing of the 3D memory array using pillars may support the decoding CuA optimization, for example minimizing a quantity of pillar decoders, sense amplifiers, or the like, while SCM specifications may be met based on memory array segmentation at a higher level (e.g., word line cutting due to the insertion of the separation layers 450').

In some examples, depending on the decoding implementation, each pillar 480 may be coupled with a respective pillar selector (e.g., a switching component or transistor) located at a top, a bottom, or both a top and a bottom (e.g., below or above the set of word line plates) of the 3D memory arrays. Spatially related terms, including but not limited to, "top," "bottom," "lower," "upper," "beneath," "below," "above," etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

Figure 6:
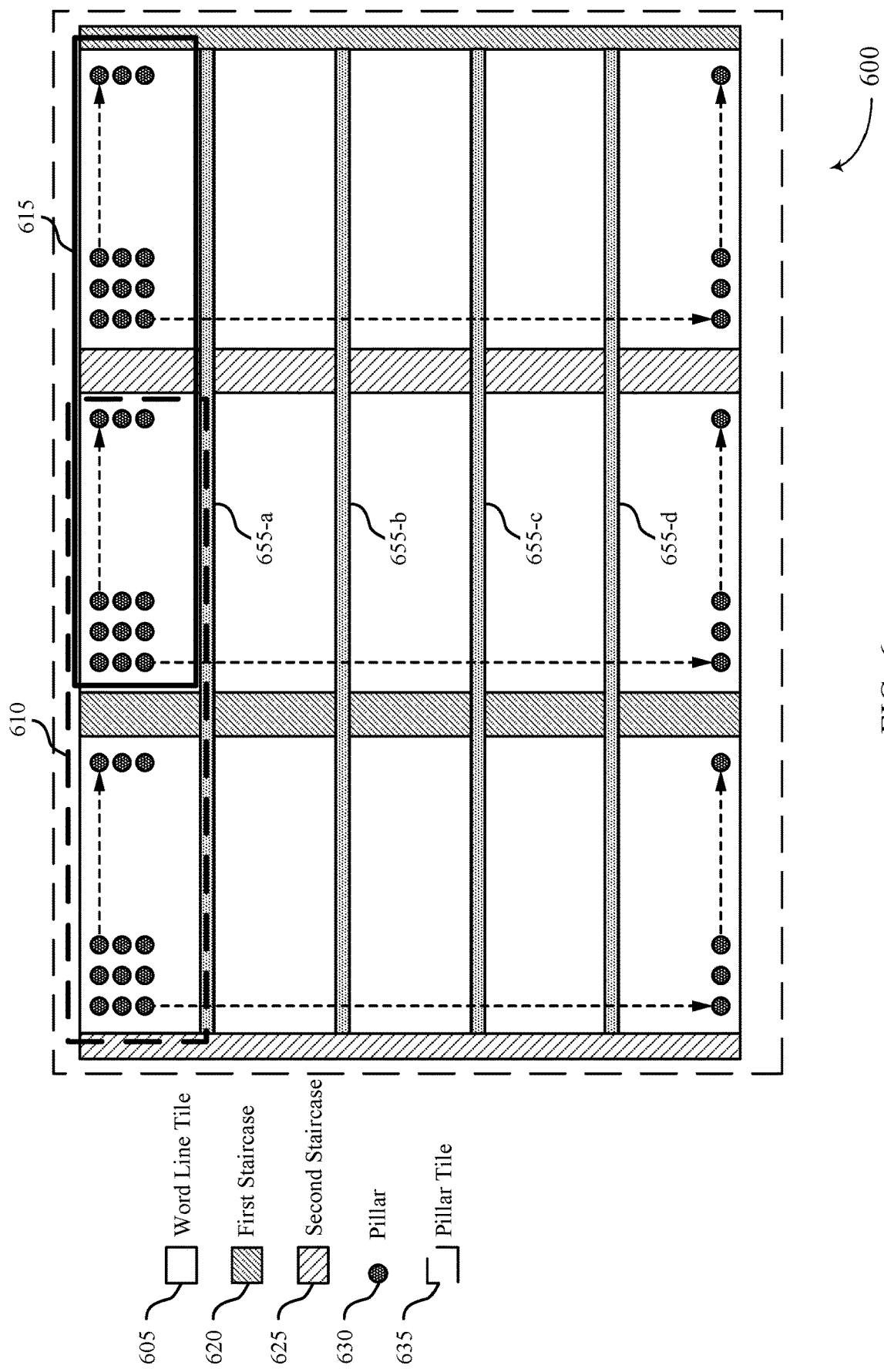
FIG. 6 illustrates an example of an array architecture that supports a decoding architecture for memory tiles in accordance with examples as disclosed herein.

FIG. 6 illustrates an example of an array architecture 600 that supports a decoding architecture for memory tiles in accordance with examples as disclosed herein. Array architecture 600 may represent an array that includes multiple pillars 630, which may represent examples of pillars described elsewhere herein, such as with reference to FIGS. 3-5. For example, each pillar 630 may extend through a stack of materials that includes alternating layers of dielectric or insulating material and word line plates. Each pillar 630 may also be coupled with one or more memory cells (e.g., two memory cells) at each word line plate layer. The view illustrated by FIG. 6 may represent a top or bottom view of the array, such that the pillars 630 may extend in and out of the page. The pillars 630 may be arranged in rows and columns throughout the array architecture 600, for example, including locations not illustrated by FIG. 6 for the sake of visual clarity (e.g., pillar columns and rows may largely fill each word line tile 605). Although the pillars 630 are shown arranged in a linear fashion, the pillars 630 may additionally or alternatively be arranged in another geometric pattern (e.g., staggered), as described with reference to FIGS. 4 and 5.

Array architecture 600 may include multiple word line tiles 605, which may each represent a set of word line plates separated from word lines of other word line tiles 605, for example, by staircases 620 and 625 and by slots 655. Each word line tile 605 may include one or more sets of two independently addressable word line plates, which may face each other (e.g., as interlocking comb structures, which may alternatively be referred to as combs with interdigited fingers, though such details may be omitted in FIG. 6 and illustrated in greater detail elsewhere for the sake of clarity with respect to other details illustrated in FIG. 6), and which may be separated by dielectric or insulating material in a serpentine or other shape as described with reference to FIGS. 4 and 5. Additionally or alternatively, a word line tile 605 may represent a vertical stack of word line plates (e.g., or memory cells coupled therewith) that may be independently (e.g., individually) activated or deactivated using one word line decoder. The word line plates within a word line tile 605 may be located at alternating layers of the stack of materials, as described with reference to FIG. 3, such that a word line plate of the array architecture 600 may be located above or below one or more other word line plates of the same word line tile 605.

A size of a word line tile 605 (e.g., a length and width, based on a quantity and length of fingers of associated word line plates) may be based on a capacitance of the word line tile 605 or the word line plates therein with relation to one or more SCM specifications (e.g., may be sized to meet the SCM specification(s)).

Different word lines plates (and thus different word lines) at different levels of the stacks (e.g., tiers) and at different locations of the array architecture 600 may be accessed or activated using word line decoding circuitry (e.g., one or more word line decoders). A word line decoder may, for example, activate one or more selected word line plates of a stack of word line plates (e.g., having multiple tiers) via a staircase 620 or 625 (e.g., an electrode or a series of electrodes with varying heights) while deactivating or maintaining as deactivated one or more other word line plates of the stack. Similarly, different pillars 630 may be accessed or activated using pillar decoding circuitry (e.g., pillar decoders), which may activate or access a pillar row line (e.g., a pillar source line) a pillar column line (e.g., a pillar gate line) associated with a selected pillar 630.

In order to reduce a footprint of decoding circuitry, sense amplifiers, or other supporting circuitry for operating a memory array having the array architecture 600 (e.g., to support such circuitry being implemented as CuA), two word line plates of different word line tiles 605 may share a staircase 620 or 625. The two word line plates sharing an electrode within the staircase 620 or 625 may be (or alternatively include) a page 610 or 615 for accessing memory cells (e.g., a logical page for accessing memory cells) at a same level of the array architecture 600. For example, a first page 610 (e.g., an even page) may include two first word line plates extending away from (e.g., to the left and right of) a first staircase 620 and a second page 615 (e.g., an odd page) may include two second word line plates extending away from (e.g., to the left and right of) a second staircase 625. Thus, for example, the word lines or fingers of a right-extending word line plate of the first page 610 may interlock with (but be separated from by a serpentine trench) the word lines or fingers of left-extending word line plate of the second page 615.

In some examples, with reference to FIG. 6, word line decoding circuitry included in CuA below a pillar tile 635 may be operable to activate (e.g., individually) any word line plate out of a set of vertically stacked word line plates (e.g., tiers) included in a word line tile 605 of the pillar tile 635. A word line decoder of the decoding circuitry may include or be coupled with one or more word line drivers, and each word line driver may be associated with (e.g., coupled with) a word line plate or a pair of word line plates (e.g., word line plates associated with adjacent word line tiles 605 and coupled with a shared staircase 620 or 625) in a same respective tier of the stack of word line plates (e.g., the word line plates of the pair may be in a same plane as each other). As such, activating a word line driver may activate a selected word line plate (e.g., one or more word line plates coupled with the word line driver) of the stack of word line plates.

For example, a first word line driver of (e.g., included in or coupled with) a first word line decoder may be operable to activate a first selected word line plate within a first word line tile 605 to the left of a first staircase 620 and to activate (e.g., concurrently) a second selected word line plate within a second word line tile 605 to the right of the first staircase 620. The first selected word line plate within the first word line tile 605 to the left of the first staircase 620 and the second selected word line plate within the second word line tile 605 to the right of the first staircase 620 may both be coupled with a same electrode within the first staircase 620, and thus the first word line driver may concurrently activate the two word line plates within the two adjacent word line tiles, and thus a corresponding page 610, by applying a select voltage to the shared electrode within the first staircase 620 for the two word line plates. A second word line driver of the first word line decoder may similarly be operable to active a third selected word line plate within the first word line tile 605 and a fifth selected word line plate within the second word line tile 605 that may be located above or below the first word line plate and the second word line plate, respectively in the stack of word line plates.

A second word line decoder may similarly be operable to activate a driver to activate or access a first selected word line plate within a first word line tile 605 to the left of the second staircase 625 and to activate (e.g., concurrently) a second selected word line plate within a second word line tile 605 to the right of the second staircase 625—e.g., by applying a select voltage to an electrode within the second staircase 625 that is coupled with the two selected word line plates and thereby selecting a corresponding page 615 of memory cells.

In some examples, a page 610 or 615 may include a same quantity or approximately a same quantity of memory cells as included within a word line tile 605 or a level (e.g., plane, tier) thereof, for example, based on being able to concurrently access half of the memory cells associated with two different word line tiles 605 or a level thereof (e.g., via the respective first or second word line plates of those two word line tiles 605). Sharing an electrode of a staircase 620 or 625 between two word line plates may reduce (e.g., may halve) a total quantity of staircase electrodes and a total quantity of word line decoders associated with array architecture 600, for example, in comparison with architectures in which word line plates within adjacent word line tiles 605 do not share electrodes (e.g., in which staircases are dedicated to a single word line tile 605, versus pairs or other sets of word line tiles 605).

Each first word line plate may be selectively activated using a respective first word line driver of a first word line decoder (e.g., first decoding circuitry) and each second word line plate may be selectively activated using a respective second word line driver of a second word line decoder. In some examples, to activate a first word line plate (or a pair of first word line plates), a first word line decoder may activate or apply a voltage to a corresponding electrode within a first staircase 620 (e.g., using a respective word line driver of the word line decoder). Similarly, to activate a second word line plate (or a pair of second word line plates), a second word line decoder may selectively activate or apply a voltage to a corresponding electrode within a second staircase 625 (e.g., using a respective word line driver of the word line decoder).

Similarly, to reduce the footprint of CuA and other peripheral or supporting circuitry for the array architecture, a pillar tile 635 may be associated with multiple word line tiles 605 (e.g., any quantity of word line tiles 605, such as 15 or 16 word line tiles 605). In some cases, a pillar tile 635 may include or be associated with a non-integer quantity of word line tiles 605 (e.g., based on the independence between word line tiles 605 and pillar tiles 635), for example, based on one or more connectivity and spacing constraints (e.g., to decrease crowding a connectivity between the array and CuA). A pillar tile 635 may represent a portion of the pillars 630 of the array architecture 600 that may be accessed using one set of complementary decoders, such as a set of one X-direction pillar decoder for decoding pillar lines that that run in the Y direction (e.g., a first pillar decoder for decoding pillar column lines) and one Y-direction pillar decoder for decoding pillar lines that that run in the X direction (e.g., a second pillar decoder for decoding pillar row lines).

A pillar tile 635 may define (e.g., independently from the boundaries of a word line tile 605) a total area (e.g., maximum area) of pillars 630 and associated memory cells that may be decoded using a first pillar decoder (e.g., in an X direction) and corresponding second pillar decoder (e.g., in a Y direction). A size of a pillar tile 635 (e.g., a length and width, based on a length of the pillar decoders and an associated quantity of pillars 630) may be based on a capacitance of the pillar tile 635 with relation to one or more SCM specifications (e.g., may be sized to meet the SCM specification(s)).

The first pillar decoder and the second pillar decoder for a pillar tile 635 (e.g., pillar decoding circuitry) may be used to selectively access a pillar 630 within the pillar tile 635. For example, the first pillar decoder may be used to access or activate a pillar column line and the second pillar decoder may be used to selectively access or activate a pillar row line. The pillar column line may activate one or more switching components coupled with the pillar column line, which may couple the pillar 630 with the activated pillar row line and thereby select or activate the pillar 630 associated with the activated pillar column line and the activated pillar row line (e.g., because a switching component, such as a pillar selector 345, may be activated based on a difference between the voltage of the corresponding pillar column line and the voltage of the corresponding pillar row line, which may be coupled with a source or drain of the switching component where, for example, the switching component is or includes a transistor). A voltage may be applied to the pillar 630 via the pillar row line (e.g., while the associated pillar selector is activated).

In some cases, the first pillar decoder and the second pillar decoder may represent areas for contacting other decoders that may operate at a more global level (e.g., device-level), for example, if a multiple-TFT decoder is located below each pillar 630 (e.g., for coupling the pillar 630 and a pillar row line to activate the pillar 630, as a pillar selector 345). In cases where a single TFT is located below each pillar 630, the first pillar decoder and the second pillar decoder may represent a decoding level for the pillars of the pillar tile 635.

Associating a pillar tile 635 with multiple word line tiles 605 (e.g., such that the pillar tile 635 is larger than the word line tiles 605 and includes pillars 630 coupled with memory cells within multiple word line tiles 605) may reduce a footprint of pillar decoders, for example, by supporting one pillar decoder or set of complementary pillar decoders for all of the pillars 630 of the pillar tile 635 (e.g., as opposed to one pillar decoder or set of complementary pillar decoders for each word line tile 605).

In some cases, word line decoding circuitry (e.g., word line decoders and word line drivers) that is operable to access word line plates in a pillar tile 635 may be located below a memory array having array architecture 600 (e.g., may be included in the CuA of the memory array). For example, all or a portion of the word line decoding circuitry for the word line plates (and thus the word line tiles 605) included in a pillar tile 635 may be located below the pillar tile 635 (e.g., between the pillar tile 635 and a substrate, within the footprint of the pillar tile 635). In some examples, at least a portion of the word line decoding circuitry for a pillar tile 635 may be below the pillar tile and aligned with (e.g., abutted to or positioned next to) an edge of the pillar tile 635 (e.g., aligned with an edge of the footprint of the pillar tile 635), and may be shared between one or more adjacent pillar tiles 635 (e.g., may also be operable to access word line plates in the one or more adjacent pillar tile 635).

Similarly, pillar decoding circuitry (e.g., pillar decoders) that is operable to access the pillars 630 in a pillar tile 635 may be located below a memory array having array architecture 600 (e.g., may be included in the CuA of the memory array). For example, all or a portion of the pillar decoding circuitry for the pillars 630 included in a pillar tile 635 may be located below the pillar tile 635 (e.g., between the pillar tile 635 and the substrate, within the footprint of the pillar tile 635). In some examples, at least a portion of the pillar decoding circuitry may be below the pillar tile 635 and aligned with (e.g., abutted to or positioned next to) an edge of the pillar tile 635 (e.g., aligned with an edge of the footprint of the pillar tile 635), and may be shared between one or more adjacent pillar tiles 635 (e.g., may also be operable to access pillars 630 in the one or more adjacent pillar tiles 635).

A memory cell may be accessed (e.g., for a read or a write operation) by activating a corresponding pillar 630 and word line plate. For example, a first voltage may be applied to a pillar column line using a first pillar decoder for the pillar tile 635, and a second voltage may be applied to a pillar row line using a second, complementary pillar decoder for the pillar tile 635, which may activate or access a corresponding pillar 630 (e.g., at an intersection of the pillar column line and the pillar row line). Similarly, a third voltage may be applied to a word line plate (e.g., the word line plate may be activated) using the word line decoding circuitry for the pillar tile 635 to access a memory cell coupled with the activated pillar 630. For example, the memory cell may be coupled with the word line plate and with the pillar 630 and may be accessed based on the respective voltages applied to the word line plate and the pillar 630.

In some cases, array architecture 600 may support parallel or simultaneous access operations for two or more memory cells within a same page 610 or 615 (e.g., two or more memory cells coupled with pillars 630 in a same column of pillars 630), which may increase access operation speed and/or data throughput. In some cases, two or more memory cells associated with a same column of pillars 630 may be concurrently accessed so long as memory cells on opposite sides of a same word line finger are not concurrently accessed. For example, within a pillar tile 635, one pillar column line may be activated by a first pillar decoder, and every other pillar row line (or some other subset of pillar row lines in which no two pillar row lines are adjacent) may be concurrently activated by a second pillar decoder, thereby concurrently activating every other pillar 630 within a column of pillars 630 (or some other subset of pillars 630 in which no two activated pillars within the column are adjacent). In some such cases, one word line plate per word line tile 605 may be activated at a time by a corresponding word line decoder (e.g., for a given activated pillar 630, one memory cell may be accessed based on concurrently activating, out of multiple vertically stacked word line plates coupled with memory cells that are coupled with the pillar 630, the word line plate coupled with the one memory cell). And in some cases, word line plates within any quantity of even pages 610 or odd pages 615 may be concurrently activated by corresponding word line decoders, thus supporting concurrent access of two or more memory cells associated with a same column of pillars 630 across any quantity of word line tiles 605.

Additionally or alternatively, in some cases, array architecture 600 may support partially parallel access operations for two or more memory cells within a same page 610 or 615 (e.g., two or more memory cells coupled with pillars 630 in a same row of pillars 630), which may increase access operation speed and/or data throughput. For example, within a pillar tile 635, a first pillar column line may be activated by a first pillar decoder, and every other pillar row line (or some other subset of pillar row lines in which no two pillar row lines are adjacent) may be concurrently activated by a second pillar decoder, thereby concurrently activating every other pillar 630 within a first column of pillars 630 (or some other subset of pillars 630 in which no two activated pillars within the first column are adjacent). One or more word line plates may also be concurrently activated by one or more corresponding word line decoders to access memory cells coupled with the activated pillars 630 within the first column. Subsequently, the first pillar column line may be deactivated by the first pillar decoder, and a second pillar column line may be activated by the first pillar decoder, possibly while the one or more word line plates remain activated.

Thus, different memory cells coupled with pillars 630 in different columns of pillars 630 may be accessed while the one or more word line plates remain activated, based on activating different pillar column lines in sequential fashion. In some cases, the same one or more pillar row lines may also remain activated while the one or more word line plates remain activated, such that different memory cells coupled with different pillars 630 in the same one or more rows of pillars 630 but different columns of pillars 630 may be accessed in partially parallel fashion (e.g., while a same set of one or more word line plates remains activated, while a same set of one or more pillar row lines remains activated, or both). And in some cases, different pillar row lines may be activated as different pillar column lines are activated, such that different memory cells coupled with different pillars 630 in different rows of pillars 630 and different columns of pillars 630 may be accessed in partially parallel fashion. In some cases, such partially parallel access may occur for two or memory cells distributed across the left-hand word line plate and the right-hand word line plate of a page 610 or page 615.

Figure 7A:
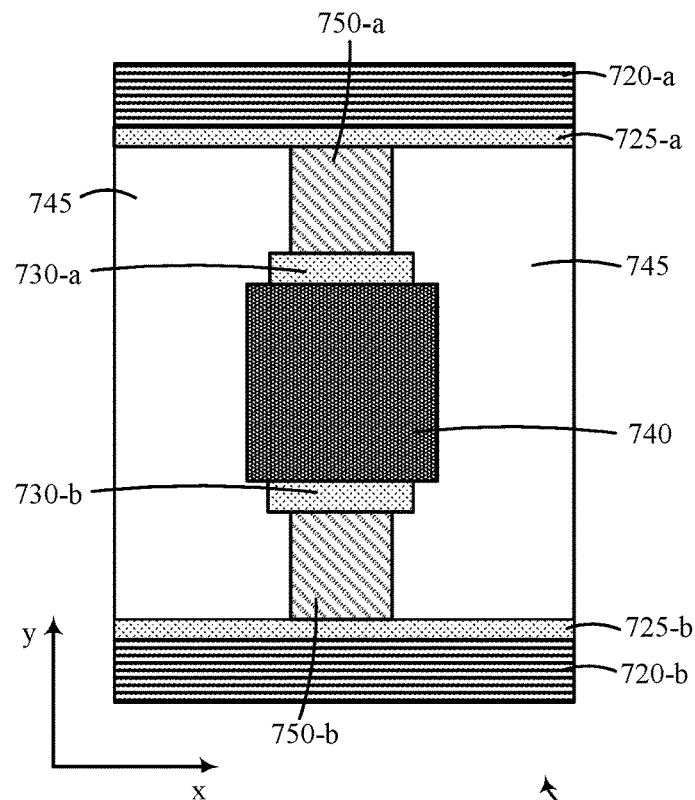
FIG. 7A illustrates an example of a memory cell architecture that supports a decoding architecture for memory tiles in accordance with examples as disclosed herein.

FIG. 7A illustrates an example of a memory cell architecture 705 that supports a decoding architecture for memory tiles in accordance with examples as disclosed herein. The memory cell architecture 705 may be used for memory cells 750, which may be examples of memory cells that may be included within a memory array described herein. The memory cells 750 may be accessed via a respective word line 720 (e.g., word line 720-*a* or word line 720-*b*) and a pillar 740 (e.g., a bit line or a selectable portion thereof). The pillar 740 may represent an example of a pillar described with reference to FIGS. 3-6, among other examples described herein. Word line 720-*a* may represent a first word line finger of a first word line plate, and word line 720-*b* may represent a second word line finger of a second word line plate, as described herein. For example, as described with reference to FIG. 4 (e.g., among other examples), fingers of the first word line plate and the second word line plate may extend in parallel but opposition directions (e.g., one to the right and away from a spine of the first word line plate, the other to the left and away from a spine of the second word line plate) and may interlock with each other. The view illustrated by FIG. 7A may represent a top view of the memory cell architecture 705, such that the pillar 740 may extend out of the page.

The memory cell architecture 705 may include a first memory cell 750-*a* (e.g., which may be or include a first chalcogenide element) and a second memory cell 750-*b* (e.g., which may be or include a second chalcogenide element). As described herein, a chalcogenide element may be a storage element that includes one or more chalcogenide glasses for storing a logic state within a memory cell 750. The memory cells 750-*a* and 750-*b* may be coupled with the pillar 740 via first electrodes 730-*a* and 730-*b*, respectively. The memory cells 750-*a* and 750-*b* may be coupled with a respective word line 720 via second electrodes 725-*a* and 725-*b*, respectively. The first electrodes 730 may provide a sufficient level of electrical conduction while preventing direct contact between the memory cells 750 and the pillar 740, and the second electrodes 725 may similarly provide a sufficient level of electrical conduction while preventing direct contact between the memory cells 750 and the respective word lines 720, for example, to reduce contamination (e.g., chemical contamination between the chalcogenide glass and a material of the word lines 720 or the pillar 740). In some cases, the first electrodes 730 and the second electrodes 725 may represent carbon electrodes or carbon-based electrodes. The memory cell architecture 705 may additionally include one or more dielectric materials 745 (e.g., that may provide electrical insulation between two or more components).

An overall shape of the memory cell architecture 705 (e.g., of a complementary pair of memory cells 750 at the same level of a vertical stack of word line plates and on either side of a pillar 740) may, in some cases, be a rectangular shape. For example, the shape of the memory cell architecture 705 may include a first dimension in a y-direction (e.g., $P_Y$) that may be greater than a second dimension in an x-direction (e.g., $P_X$), or vice versa.

Figure 7B:
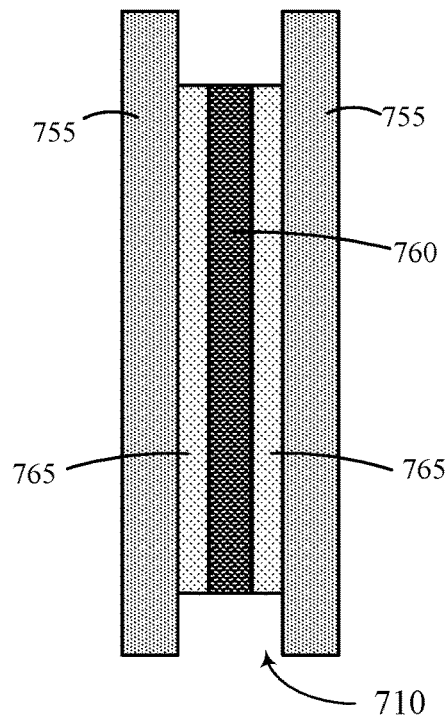
FIG. 7B illustrates an example of a pillar selector that supports a decoding architecture for memory tiles in accordance with examples as disclosed herein.

FIG. 7B illustrates an example of a pillar selector 710 that supports a decoding architecture for memory tiles in accordance with examples as disclosed herein. The pillar selector 710 may represent an example of a pillar selector 345 described with reference to FIG. 3, among other examples described herein. The pillar selector 710 may represent a transistor (e.g., a TFT or other type of transistor) and may be located beneath the memory cell architecture 705. For example, the pillar selector may be located below, and may be coupled with, a corresponding pillar 740. The view illustrated by FIG. 7B may represent a top view of the pillar selector 710, such that the pillar may be positioned on top of the pillar selector 710 (coming out of the page). The pillar selector 710 may be operable to select the pillar 740 during access operations for the memory cell 705 by coupling the pillar 740 with a pillar row line (e.g., pillar source line), for example, as described with reference to FIG. 3.

The pillar selector 710 (e.g., TFT) may include a gate 755, gate oxide material 765, and a channel material 760. The channel material 760 may be a semiconductor (e.g., a polysilicon material) or other material suitable for use as a transistor channel and may be coupled with the gate 755 via the gate oxide material 765. The gate 755 may be formed in a U-shape in a z-direction (with the two sides of the U extending upwards out of the page, and the bottom of the U below the channel material and the gate oxide material 765, where the gate oxide material may in some cases also be formed in a similar (e.g., concentric) U-shape). Thus, for example, the two sides of the gate 755 as illustrated in FIG. 7B may connect beneath the gate oxide material 765 to form one gate 755. Such a transistor gate architecture may increase a driving capability of the pillar selector 710.

In some cases, an effective transistor width of the pillar selector 710 (and thus a corresponding drive strength of the pillar selector 710, based on a transistor width) may be greater than (e.g., two times greater than) a physical width of the pillar selector 710 in the x-direction based on the two sides of the gate 755 (e.g., a U-shaped transistor architecture may have functional benefits similar to a double-gate architecture). This greater effective transistor width may increase a drive strength of the pillar selector 710, for example, in comparison with other transistors having a similar physical width in the x-direction. Thus, for example, such a U-shaped transistor gate architecture may allow for an increased effective width-to-length ratio for the pillar selector 710 while maintaining the elongated dimension of the gate 755 as aligned (e.g., parallel) with the elongated direction of the memory cell architecture 705 (e.g., both the gate 755 and the memory cell architecture 705 may be longer in the y-direction than the x-direction).

Such alignment may have space-saving benefits for a memory array as described herein. For example, in some cases, a dimension of the pillar selector 710 in the y-direction may be less than or equal to a dimension of the memory cell architecture 705 in the y-direction and/or a dimension of the pillar selector 710 in the x-direction may be less than or equal to a dimension of the memory cell 705 in the x-direction. As such, the pillar selector 710 may be located (e.g., may fit) under a corresponding pillar 740 (e.g., and the corresponding memory cell architecture 705). The structure and alignment of the memory cell architecture 705 and the pillar selector 710 thus may support an increased driving capability for the pillar selector 710 (e.g., a maximum driving capability of the pillar selector 710), overall space savings for a memory array, or both, among other possible benefits that may be appreciated by one of ordinary skill the art.

The gate 755 of the pillar selector 710 may be coupled with a pillar column line, and a source (e.g., a left or right side of the channel 760 in the x-direction) of the pillar selector 710 may be coupled with a pillar row line. Accordingly, in some cases, a pillar column line may be referred to as a pillar gate line, and a pillar row line may be referred to as a pillar source line. A drain (e.g., the opposite side of the channel 760 in the x-direction as the source) of the pillar selector 710 may be coupled with a pillar 740, such that the pillar selector 710 may couple the pillar 740 with the pillar row line, for example, when the corresponding pillar column line applies an activation voltage to the gate 755 of the pillar selector 710.

Figure 7C:
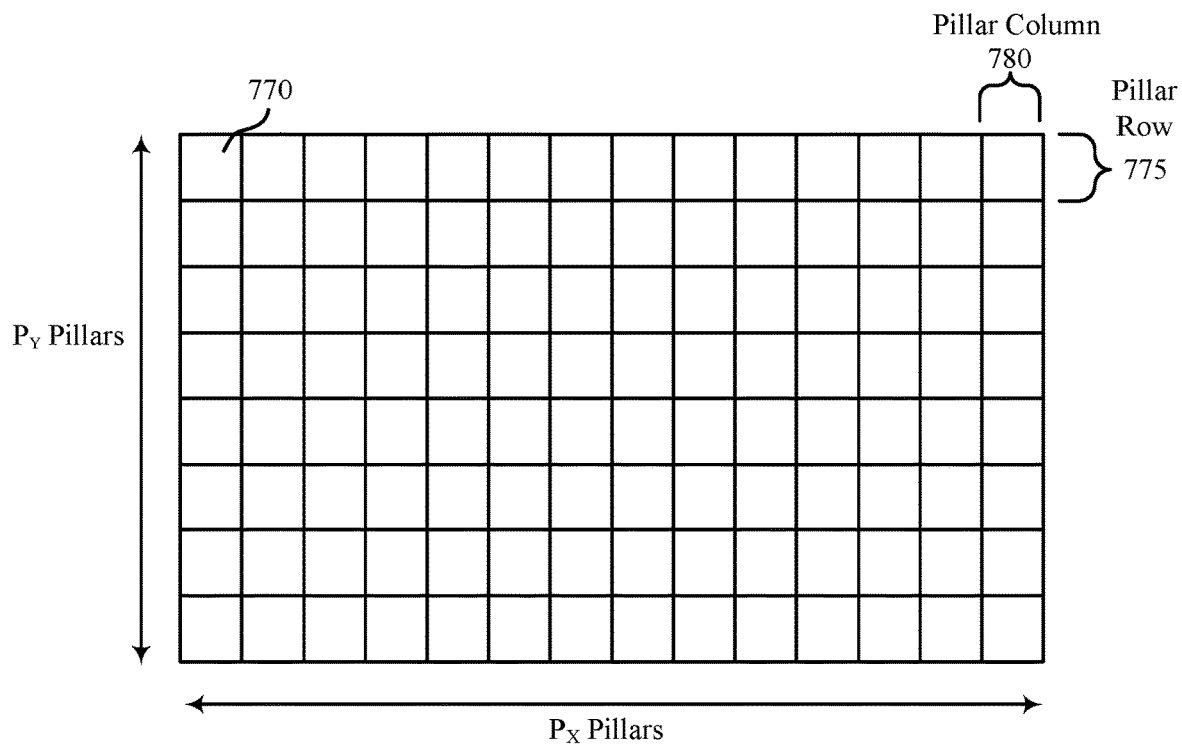
FIG. 7C illustrates an example of a pillar tile that supports a decoding architecture for memory tiles in accordance with examples as disclosed herein.

FIG. 7C illustrates an example of a pillar tile 715 that supports a decoding architecture for memory tiles as described herein. The pillar tile 715 may be an example of a pillar tile as described herein, for example, with reference to FIG. 6. The pillar tile 715 may include multiple pillar units 770, where each pillar unit 770 may include or represent an example of the memory cell architecture 705 described herein (e.g., may each include one corresponding pillar 740 and two stacks of memory cells coupled with the pillar 740). The pillar units 770 and corresponding pillars 740 may be distributed across the pillar tile 715 in the x- and y-directions. Although the pillar units 770 and corresponding pillars 740 are shown arranged in a linear fashion, the pillar units 770 and pillars 740 may additionally or alternatively be arranged in another geometric pattern (e.g., staggered), for example, as described with reference to FIGS. 4 and 5.

The pillar tile 715 may include multiple pillar rows 775 and pillar columns 780 (e.g., rows and columns of pillars 740). Each pillar column 780 may each be associated with a respective pillar column line (e.g., pillar gate line) running in the y-direction, and each pillar row 775 may each be associated with a respective pillar row line (e.g., pillar source line) running in the x-direction. The pillar column lines may be associated with a first pillar decoder for the pillar tile 715 (e.g., a pillar gate line or pillar column line decoder) and the pillar row lines may be associated with a second pillar decoder for the pillar tile 715 (e.g., a pillar source line or pillar row line decoder).

The first pillar decoder may be operable to selectively activate (e.g., apply a selection or activation voltage) or deactivate (e.g., apply a deselection or deactivation voltage to) the pillar column lines of the pillar tile 715 independent of one another (e.g., one at a time, or any subset or all of them concurrently). The second pillar decoder may be operable to selectively activate (e.g., apply a selection or activation voltage) or deactivate (e.g., apply a deselection or deactivation voltage to) the pillar row lines of the pillar tile 715 for the pillar tile 715 (e.g., one at a time, or any subset or all of them concurrently). As such, the pillar tile 715 may include a total area or quantity (e.g., maximum area) of pillars 740 and associated memory cells 750 that may be activated or selected using a first pillar decoder (e.g., in an X direction) and a second, complementary pillar decoder (e.g., in a Y direction).

A pillar 740 of the pillar tile 715 may be activated by applying a first voltage (e.g., a first selection voltage) to a corresponding pillar column line and a second voltage to a corresponding pillar row line. Applying the first voltage may activate pillar selectors 710 coupled with the pillar column line. When activated, each pillar selector 710 may couple a corresponding pillar 740 on the pillar column line with a respective pillar row line. Applying the second voltage (e.g., a second selection voltage) to the pillar row line may result in applying the second voltage (e.g., or a voltage near the second voltage) to a pillar 740 located at a junction of the activated pillar column line and the pillar row line (e.g., based on the pillar 740 being coupled with the pillar row line via a corresponding, activated pillar selector 710). In such cases, the pillar 740 may be referred to as being selected or activated.

Each pillar row 775 may include a first quantity of pillars 740 (e.g., $P_X$) distributed in the x-direction, and each pillar column 780 may include a second quantity of pillars 740 (e.g., $P_Y$) distributed in the y-direction. In some examples, more pillars 740 may be included in a pillar row 775 than in a pillar column 780, or alternatively, more pillars 740 may be included in a pillar column 780 than in a pillar row 775. Additionally or alternatively, the pillar tile 715 may have a different dimension in the x-direction than the y-direction (e.g., a greater quantity of pillars 740 in the x-direction) based on the rectangular shape of an associated memory cell architecture (e.g., memory cell architecture 705).

In some cases, a dimension of a pillar tile 715 in the y-direction (e.g., a length of pillar gate lines) may be based on a capacitance or other quality of pillar gate lines (e.g., pillar column lines) of the pillar tile 715, such that a speed for activating a pillar gate line may meet one or more thresholds (e.g., a specification of a memory velocity). In some cases, a capacitance or other quality of the pillar source lines may support a dimension of a pillar tile 715 in the x-direction (e.g., a length of the pillar source lines) that is greater than a dimension of the pillar tile 715 in the y-direction, may support a pillar tile 715 including more pillars in the x-direction than in the y-direction, or both. It is to be understood, however, that a pillar tile 715 may include any quantity of pillars 740 in any direction without deviating from the teachings herein.

The pillar tile 715 may include multiple word line tiles as described elsewhere herein, and which may each include one or more word line plates having a comb structure of interdigited word line fingers. The word line plates within a word line tile may be stacked in a z-direction (out of the page). The fingers of each word line plate may extend horizontally in the x-direction across a respective word line tile.

The size of a word line driver included in or coupled with a word line decoder may be determined based on a capacitance of a word line plate and a desired activation response time, and thus a desired drive current capability. As a quantity of word line tiles included in a pillar tile 715 increases, the quantity of word line plates in each vertical stack within the word line tiles increases (e.g., a quantity of tiers of the memory array in the z-direction), or both, a quantity of word line drivers for driving (e.g., applying a voltage to) the respective word line plates included in the pillar tile 715 may increase proportionally (e.g., a drive capacity of a word line decoder may increase as a total capacitance of a word line tile increases). In such cases, an area (e.g., an area within the CuA) of the pillar tile 715 occupied by such word line drivers may increase accordingly.

Figure 8A:
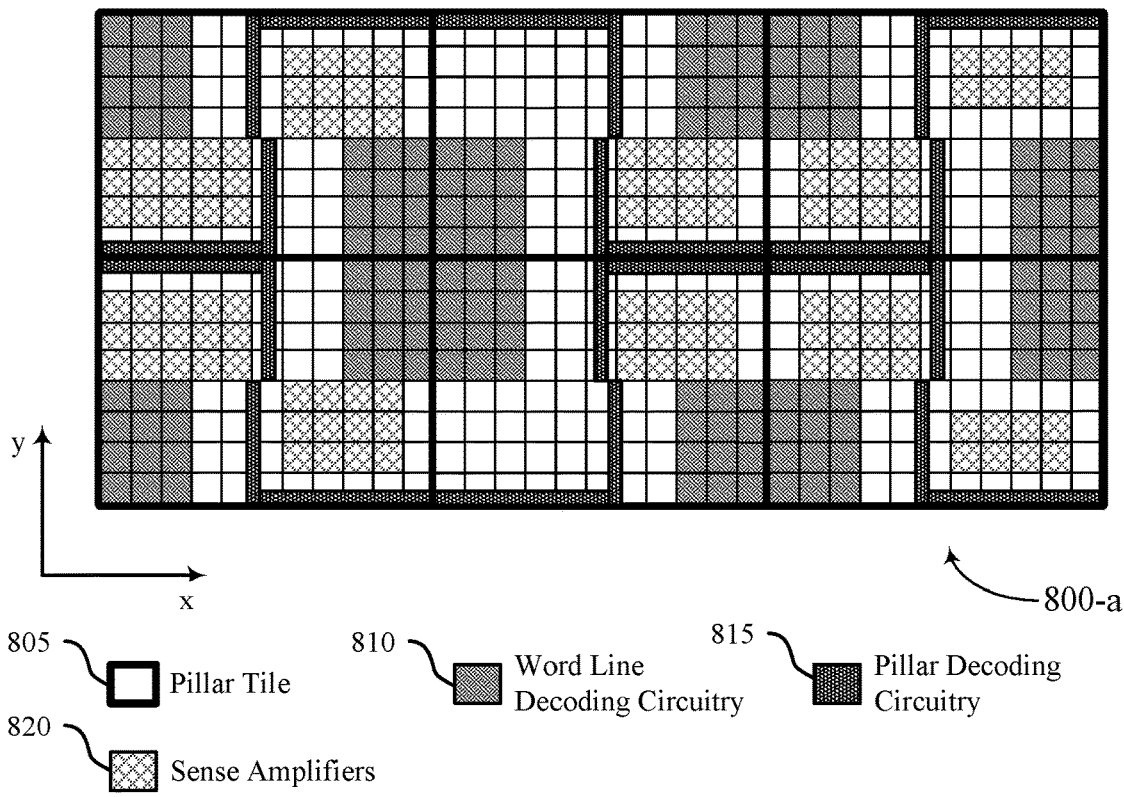
FIGS. 8A and 8B illustrate examples of pillar tile architectures that support a decoding architecture for memory tiles in accordance with examples as disclosed herein.
Figure 8B:
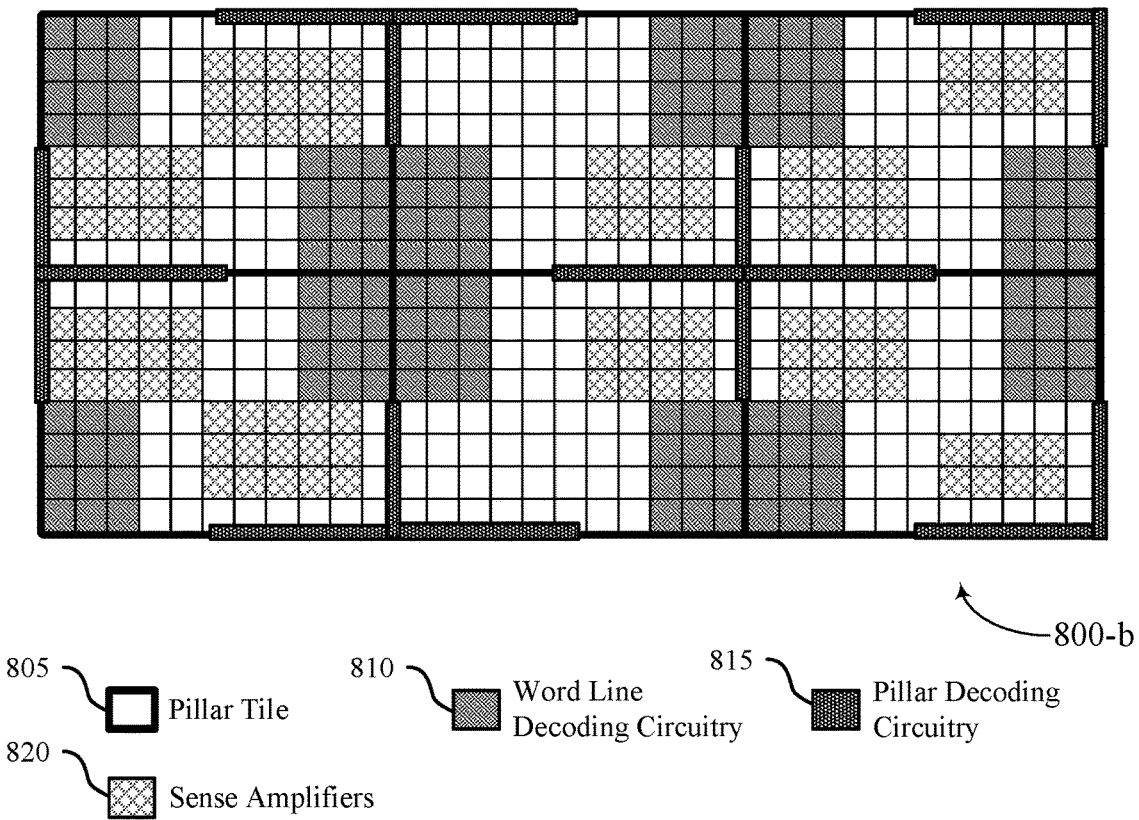

FIGS. 8A and 8B illustrate respective examples of pillar tile architectures 800-*a* and 800-*b* that support a decoding architecture for memory tiles in accordance with examples as disclosed herein. The pillar tile architectures 800-*a* and 800-*b* may illustrate architectures in which decoding circuitry and supporting circuitry for operating a memory array may be located below one or more pillar tiles 805 (e.g., may be implemented as CuA for the one or more pillar tiles 805). A pillar tiles 805 may represent an example of a pillar tile described herein, such as with reference to FIGS. 6 and 7. The CuA for each pillar tile 805 may include word line decoding circuitry 810 (e.g., which may include word line decoders), pillar decoding circuitry 815 (e.g., which may include pillar decoders), and sense amplifiers 820 located below (e.g., within a footprint of) a corresponding set of memory cells and access lines included in the pillar tile 805, each of which may be examples of such components as described elsewhere herein.

Word line decoding circuitry 810 may be shared across two or more adjacent pillar tiles 805. For example, the word line decoding circuitry 810 may be aligned with an edge of two or more pillar tiles 805 and may be shared across the two or more pillar tiles 805. Word line decoding circuitry 810 may include some quantity of word line drivers, each of which is operable to drive a corresponding word line plate (or a corresponding set of word line plates, where multiple word line plates may be driven via a common electrode) to a desired voltage (e.g., a select voltage or a deselect voltage). In some cases, word line decoding circuitry 810 may occupy a contiguous area that underlies (e.g., spans portions of the footprint of) multiple pillar tiles 805 (e.g., a contiguous area that underlies two or four pillar tiles 805 as shown in FIG. 8) and may include one or more word line decoders each operable to drive at least one word line plate within two or more of the overlying pillar tiles 805.

For example, the word line decoding circuitry 810 occupying a contiguous area that underlies two or more pillar tiles 805 may be coupled with a first word line plate within a first pillar tile 805 of the two or more pillar tiles 805 and a second word line plate within a second pillar tile 805 of the two or more pillar tiles 805 (and potentially also a third word line plate within a third pillar tile 805 of the two or more pillar tiles 805 and a fourth word line plate within a fourth pillar tile 805 of the two or more pillar tiles 805). The word line decoding circuitry 810 may thereby be operable to activate (e.g., concurrently or non-concurrently activate) word line plates that are associated with (e.g., coupled with memory cells that are in turn coupled with pillars within) two or more adjacent pillar tiles 805. The word line decoding circuitry 810 may include one or more word line decoders that may each include multiple word line drivers. Each word line decoder may correspond to one or more word line tiles and may be operable to activate or deactivate individual word line plates within a corresponding word line tile. For example, each word line decoder may include a set of word line drivers, where each word line driver is operable to activate one word line plate out of a set of (e.g., stack of) word line plates within a corresponding word line tile, or in some cases operable to concurrently activate multiple word line plates that are each in different corresponding word line tiles (e.g., different stacks, possibly at the same level within the different stacks) but are coupled with the word line driver via a common electrode (e.g., a common staircase electrode). Sharing of word line decoders, drivers, or both across adjacent pillar tiles 805 as described herein thus may reduce the number of word line decoders, drivers, or both included in the word line decoding circuitry 810 located below an individual pillar tile 805, thereby, for a memory array that includes multiple pillar tiles 805, enhancing an ability to locate all associated word line decoding circuitry 810 below the memory array.

An area occupied by the word line decoding circuitry 810 under a given pillar tile 805 may increase as a quantity of word line plates associated with each pillar tile 805 increases (e.g., based on one a quantity of word line tiles in the pillar tile 805, based on a quantity of word line plates within a word line tile—such as the quantity of tiers of the memory array and thus the word line tile in a z-direction, or both). The view illustrated in FIGS. 8A and 8B may represent a top view of the pillar tiles 805, such that a stack of word line plates within a word line tile (e.g., each word line plate of the stack corresponding to one tier of the memory array) may extend out of the page. The area occupied by a contiguous area of word line decoding circuitry 810 may be associated with a quantity of word line drivers for driving respective word line plates in each pillar tile 805 (e.g., with each word line driver driving a respective word line plate within a corresponding word line tile or a respective set of word line plates within a corresponding set of word line tiles).

A size of each individual word line driver may, in some cases, be independent of the quantity of word line plates (and thus the quantity of word line tiles) in a pillar tile 805. For example, each word line driver may drive one or more word line plates each having a known capacitance to a desired access voltage within a desired time period (e.g., a timing specification), and the size of each word line driver (e.g., a transistor width) may be associated with a respective driving strength of the word line driver (e.g., for driving the one or more word line plates). Thus, the size of the individual word line drivers within the word line decoding circuitry 810 may be based on dimensional and electrical qualities (e.g., a capacitance, a length) of the word line plates of the memory array.

A quantity of word line drivers associated with a pillar tile 805 may be based on a quantity of word line plates in a pillar tile 805 that are independently addressable (e.g., able to be activated or deactivated independently of each other). For example, within a tier of a memory array, an overall quantity of word line fingers may depend on a quantity of pillars within the pillar tile 805 along a given dimension (e.g., if the word line fingers extend in the x-direction, then the overall quantity of word line fingers within a pillar tile 805 may depend on the quantity of pillars included in a column of pillars in the y-direction that spans the pillar tile 805). Word line fingers may be grouped into separate word line plates within the tier in order to reduce a capacitance of the individual word line plates. For example, if a column of pillars within a pillar tile 805 includes 1,024 pillars, then a tier of the pillar tile 805 may include 512 rightward-extending word line fingers and 512 leftward-extending word line fingers that may span the pillar tile 805 in the y-direction, with each word line finger extending between two pillars of the column (as shown, for example, in FIGS. 4 and 5). It is to be understood that these and any other specific numeric examples provided herein are for the sake of illustrative clarity only and are not limiting of the claims or the disclosure.

Rather than a single word line comb having 512 fingers, both sets of 512 word line fingers may be divided across a set of separate word line plates (e.g., to reduce a capacitance associated with each individual word line plate). For example, in the y-direction within a given tier of the pillar tile 805, a first set of eight (8) word line plates each having 64 fingers may provide a total of 512 rightward-extending word line fingers, and a second set of 8 word line plates each having 64 fingers may provide a total of 512 leftward-extending word line fingers. Each of the 16 word line plates may be included in a separate word line tile, where the word line tile may include a vertical stack (e.g., stacked in the z-direction) of word line plates each also having 64 fingers. The number of word line plates in a vertical stack may be equal to the number of tiers of the memory array.

In some cases, each vertical stack of word line plates (e.g., each word line tile) within a pillar tile 805 may be independently addressable. Within a vertical stack of word line plates, the different word line plates may be independently addressable relative to one another (e.g., one word line plate at a time may be activated or deactivated within the vertical stack). For example, each vertical stack of word line plates within the pillar tile 805 may be coupled with a different respective word line decoder, and the respective word line decoder for a vertical stack may include a different, respective word line driver for each word line plate of the vertical stack. Thus, the quantity of word line drivers associated with operating the word line plates of a pillar tile 805 may depend on the quantity of word line plates within each tier of the pillar tile and the quantity of tiers. For example, if, in the y-direction, a pillar tile 805 includes 8 vertical stacks of word line plates with rightward-extending fingers and 8 vertical stacks of word line plates with leftward-extending fingers, with each vertical stack including 64 word line plates, then a total of 1,024 independently addressable word line plates may be included in the pillar tile 805, thus yielding a total of 1,024 associated word line drivers, which may be considered as including a first group of 512 word line drivers associated with the word line plates having rightward-extending fingers and a second group of 512 word line drivers associated with the word line plates having leftward-extending fingers. Thus, with such sharing, for example, the quantity of word line drivers associated with a pillar tile 805 may be equal to half of a value that is determined by multiplying the quantity of tiers in the pillar tile 805 and the quantity of word line plates in each tier (that is, a value that is equal to a total quantity of word line plates of the pillar tile 805), which may be considered as two sets of word line drivers each half that product in quantity.

If word line decoders (and thus the drivers therein) are shared by adjacent pillar tiles 805, then the total quantity of word line drivers to be located under an individual one of the pillar tiles 805 may be reduced. For example, as described elsewhere herein, a first word line plate in a first word line tile (e.g., with rightward extending fingers) within a first pillar tile 805 may be coupled with the same word line driver as a second word line plate in a second word line tile (e.g., with leftward extending fingers) within a second pillar tile 805 by way of a common electrode. The first word line plate and the second word line plate may, for example, be at a same tier within their respective word line tiles (e.g., may be coplanar).

Thus, in such an example, from the perspective of a single pillar tile 805, the quantity of associated word line drivers for purposes of placement under the pillar tile 805 may be halved (e.g., 512 word line drivers under the pillar tile 805, which may be considered as including a first group of 256 word line drivers associated with word line plates having rightward-extending fingers and a second group of 256 word line drivers associated with word line plates having leftward-extending fingers), as some word line drivers associated with the pillar tile 805 may be located under an adjacent pillar tile. Further, in such an example, a word line decoder may be considered shared between the first word line tile within the first pillar tile 805 and the second word line tile within the second pillar tile 805—an individual word line decoder may be located entirely under one of the two pillar tiles 805, or may include a first portion located under the first pillar tile 805 and a second portion located under the second pillar tile 805. As shown in FIG. 8, word line decoding circuitry located under a pillar tile 805 may be aligned with one or more edges of the pillar tile 805 (e.g., abutted to one or more edges of the footprint of the pillar tile 805).

In some cases, the CuA of each pillar tile 805 may additionally or alternatively include pillar decoding circuitry 815 for activating pillars, each of which may be individually addressable in some cases. For example, a pillar decoder (e.g., gate line pillar decoder or source line pillar decoder) in the pillar decoding circuitry 815 may selectively activate and deactivate a respective pillar column line or pillar row line for an individual row or column of pillars. As described herein, such as with reference to FIG. 7 for example, an activated pillar column line and pillar row line may activate a corresponding pillar of the memory array at a junction of the pillar column line and pillar row line. For example, the pillar column line may activate a corresponding pillar selector (or column thereof), such as a pillar selector 710 described with reference to FIG. 7B, and the pillar row line may be used to apply a voltage to the pillar via the activated pillar selector. In some cases, the pillar row lines and the pillar column lines associated with the pillar decoders may have a relatively lower capacitance compared to the word line plates associated with the word line decoders. As such, the pillar decoders may include pillar line drivers each including one or more transistors that are smaller than transistors associated with the word line drivers, and thus in some cases the pillar decoding circuitry 815 under a pillar tile 805 may occupy a smaller area than the word line decoding circuitry 810 under the pillar tile 805.

A first portion of the pillar decoding circuitry 815 (e.g., a pillar column line or pillar gate line decoder) may be split into two portions (e.g., subsets) each oriented in an x-direction within a pillar tile 805, where each of the two portions may be located near opposite edges of the pillar tile 805 (e.g., may be respectively aligned with the opposite edges, such as being respectively abutted to opposite edges of the footprint of the pillar tile 805). As depicted in FIG. 8A, a second portion of the pillar decoding circuitry 815 (e.g., pillar row line or pillar source line decoders) may be oriented in a y-direction near a middle section of the pillar tile 805. In some cases, the second portion of the pillar decoding circuitry 815 may further be split into two staggered (e.g. offset in the x-direction) portions (e.g. subsets) as shown in FIG. 8A. As described herein, the pillar decoders of the pillar decoding circuitry 815 may be operable selectively activate individual pillar row lines or pillar column lines. It is to be understood, that a pillar tile 805 as shown in FIG. 8A or 8B or otherwise as described herein may be rotated 90 degrees either clockwise or counterclockwise, such that references to x- and y-directions may be reversed.

For example, the two first portions of the pillar decoding circuitry 815 oriented in the x-direction may be operable to activate respective pillar column lines that extend in the y-direction, and the second subset of the pillar decoding circuitry 815 that extends in the y-direction may be operable to activate respective pillar row lines that extend in the x-direction. By activating a pillar column line (e.g., gate line), a pillar decoder of the pillar decoding circuitry 815 may activate a gate of a respective pillar selector (or column thereof) coupled with the activated pillar column line. Similarly, by activating a pillar row line (e.g., source line), a pillar decoder of the pillar decoding circuitry 815 may activate a source of a respective pillar selector (or respective row thereof) coupled with the activated pillar row line (e.g., and thereby apply a voltage to a pillar located at an intersection of the pillar column line and pillar row line).

A size of the pillar line drivers (e.g., and thus the size of an area occupied by the pillar decoders) of the pillar decoding circuitry 815 may be based on a resistivity and capacitance of each pillar access line (e.g., pillar column or row lines), which may be based on a length of the access line, a quantity of pillar selectors coupled with the pillar access line, or both. For example, if the resistivity or capacitance of a pillar access line increases, a driving capability of an associated pillar line driver (e.g., a transistor) may be increased in order to drive the access line in satisfaction of a desired timing specification, which may result in an increased area (e.g., width) of the corresponding pillar line driver. In one example, a quantity of pillars and corresponding pillar selectors that are associated with each pillar column line in the y-direction may correspond to a first capacitance. A pillar line driver (e.g., a pillar gate line driver) associated with a respective pillar column line may drive a first current through the pillar column line within a time period to charge the pillar column line to a desired voltage. The pillar line driver may have a minimum width to support such driving capabilities. Each pillar row line driver may be associated with a similar, corresponding width for driving respective pillar row lines based on a resistivity and capacitance of the pillar row lines.

In some cases, the pillar decoding circuitry 815 under a pillar tile 805 may include one pillar column line driver for each column of pillars within the pillar tile 805 (e.g., for each pillar column line within the pillar tile 805) and one pillar row line driver for each row of pillars within the pillar tile 805 (e.g., for each pillar row line within the pillar tile 805). Accordingly, the area of the pillar decoding circuitry 815 under a pillar tile 805 may be based on a quantity of columns of pillars and a quantity of rows of pillars within the pillar tile 805. Beneficially, the area of the pillar decoding circuitry 815 under a pillar tile 805 (e.g., based on a quantity of pillar line drivers or decoders in the pillar decoding circuitry 815) may be independent from a quantity of tiers of the memory array, which may support increasing of the tiers while retaining an ability to implement pillar decoding circuitry 815, possibly along with other circuitry, as CuA.

A remaining area of the CuA for each pillar tile 805 (e.g., area within the pillar tile 805 footprint that is not occupied by word line decoding circuitry 810 or pillar decoding circuitry 815) may include other circuitry to support operation of the pillar tile 805, such as sense amplifiers 820. Each pillar tile 805 may include a quantity of sense amplifiers 820 to support a desired quantity of parallel or concurrent access operations for multiple memory cells (e.g., parallelism) within the pillar tile. For example, each pillar tile may include a quantity of sense amplifiers 820 that corresponds to (e.g., is equal to) a quantity of pillar row lines (and thus rows of pillars) within the pillar tile 805. While some locations for sense amplifiers 820 are illustrated in FIGS. 8A and 8B, it is to be understood that the sense amplifiers 820 may be located under the pillar tile 805 in any area left unoccupied by the decoding circuitry (e.g., word line decoding circuitry 810 and pillar decoding circuitry 815).

FIG. 8B illustrates a pillar tile architecture 800-b including multiple pillar tiles 805. As illustrated in FIG. 8B, in some cases, the pillar decoding circuitry 815 (e.g., pillar decoders) in each pillar tile 805 may be aligned with respective edges of the pillar tile 805 (e.g., abutted to respective edges of the footprint of the pillar tile 805) and may be shared across adjacent pillar tiles 805. For example, pillar column decoders (e.g., occupying an area and aligned with pillar tile 805 edges that extend in the x-direction), source pillar decoders (e.g., occupying an area and aligned with pillar tile 805 edges that extend in the y-direction), or both, may be shared between adjacent pillar tiles 805. If a pillar column decoder is shared between a first pillar tile 805 and an adjacent second pillar tile 805, the pillar column decoder may be operable to selectively activate a first pillar column line within the first pillar tile 805 and a second pillar column line within the second pillar tile 805 concurrently. Similarly, if a pillar row decoder is shared between a first pillar tile 805 and an adjacent second pillar tile 805, the pillar row decoder may be operable to selectively activate a first pillar row line within the first pillar tile 805 and a second pillar row line within the second pillar tile 805 concurrently. Such sharing of pillar decoding circuitry 815 between pillar tiles 805 may halve a quantity of pillar line drivers per pillar tile 805, and thus may beneficially halve the quantity of pillar line drivers located under a pillar tile 805. For example, a quantity of pillar column line drivers under a pillar tile 805 may be equal to half of a quantity of pillar columns (and thus pillar column lines) of the pillar tile 805, a quantity of pillar row line drivers under a pillar tile 805 may be equal to half of a quantity of pillar rows (and thus pillar row lines) of the pillar tile 805, or both.

Figure 9A:
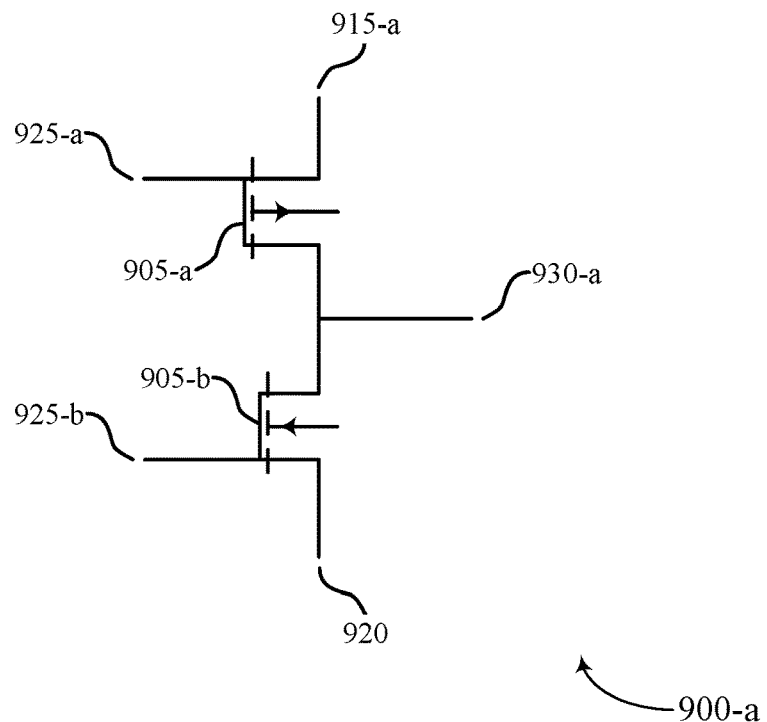
FIGS. 9A and 9B illustrate examples of word line drivers that support a decoding architecture for memory tiles in accordance with examples as disclosed herein.
Figure 9B:
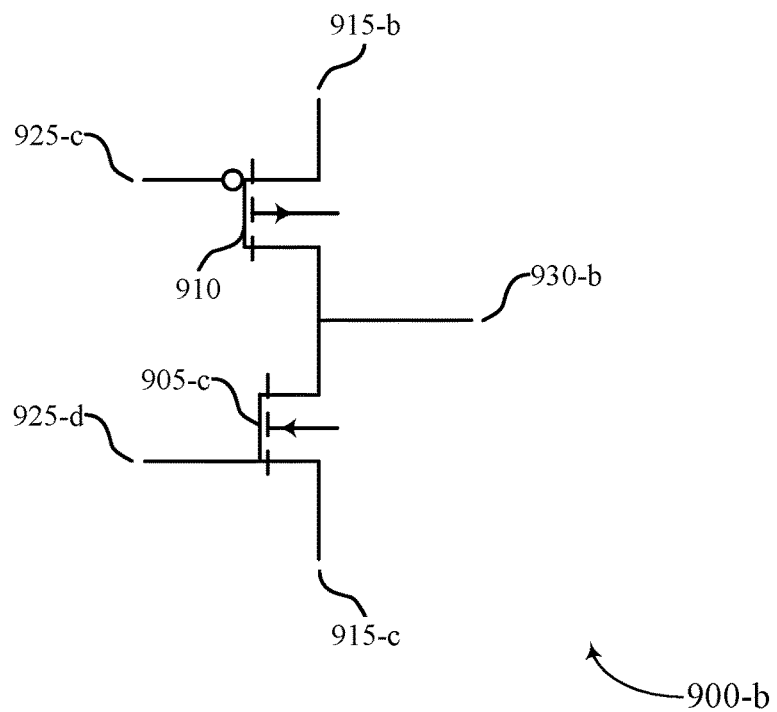

FIGS. 9A and 9B illustrate examples of word line drivers 900-a and 900-b that support a decoding architecture for memory tiles in accordance with examples as disclosed herein. A word line driver 900 may represent an example of a portion of a word line decoder as described herein, for example, with reference to FIG. 8 (e.g., among other portions). For example, word line driver 900-a, word line driver 900-b, one or more other word line drivers 900, or any combination thereof, may be included in CuA below a respective memory array, and may be used to activate one or more respective word line plate of the memory array. A word line decoder may include multiple word line drivers 900 and may be operable to activate one word line driver 900 at a time, to activate the one or more respective word line plates coupled with the word line driver 900. Word line drivers 900-a and 900-b may be operable to activate or access a respective word line plate by applying a voltage bias to an electrode coupled with the word line plate, as described herein, for example, with reference to FIG. 8.

FIG. 9A illustrates a word line driver 900-a that may include n-type transistors 905-a and 905-b (e.g., negative metal oxide semiconductor (N-MOS) transistors 905), and may be referred to as a 2N-MOS driver. Word line driver 900-a may be operable to drive (e.g., select or activate) a respective word line plate. In some examples, a word line plate signal 930-a may be output by transistors 905-a and 905-b. Word line plate signal 930-a may be applied to the word line plate via an electrode coupled with transistors 905-a and 905-b (e.g., coupled with a source of transistor 905-*a* and a drain of transistor 905-*b*), where word line plate signal 930-*a* may maintain the word line plate inactivated or may activate (e.g., select) the word line plate based on one or more input signals to the word line driver 900-*a*. For example, word line plate signal 930-*a* may be set in an inactive state (e.g., low state) until a combination of voltages are applied to the transistors 905-*a* and 905-*b*, which may cause word line plate signal 930-*a* to transition to an activate state (e.g., high state), for example, to activate the word line plate by applying a voltage bias to the electrode (e.g., and via the electrode to the word line plate). Word line plate signal 930-*a* may transition from the activate state to the inactive state in response to the combination of voltages no longer being applied to the transistors 905-*a* and 905-*b*.

A drain node of transistor 905-*a* may be configured to receive a tile selection signal 915-*a*, and a source of transistor 905-*b* may be coupled with a lower voltage supply 920 (e.g., ground). As illustrated by FIG. 8A, a source node of transistor 905-*a* may be coupled with a drain node of transistor 905-*b*. A gate of transistor 905-*a* may be configured to receive a first tier selection signal 925-*a*, and a gate of transistor 905-*b* may be configured to receive a second tier selection signal 925-*b*. The node at the source of transistor 905-*a* and the drain of transistor 905-*b* may further be coupled with the respective word line plate (e.g., via the electrode, such as a staircase electrode described herein). In some cases, the tile selection signal 915-*a*, first tier selection signal 925-*a*, or second tier selection signal 925-*b* may be provided by a memory controller (e.g., a local memory controller 165). In other cases, the tile selection signal 915-*a*, first tier selection signal 925-*a*, or second tier selection signal 925-*b* may be provided by other aspects of word line decoding circuitry (e.g., a word line decoder that includes word line driver 900-*a*).

Word line driver 900-*a* may be associated with a word line plate of a stack of word line plates (e.g., located at any level or tier within the stack of word line plates) in a word line tile, as described herein. In order to activate the word line plate, a memory device may cause tile selection signal 915-*a* to transition from a deselect voltage to a select voltage (e.g., from low to high voltage) based on a word line tile j that includes the respective word line plate for word line driver 900-*a* being selected for activation. For example, the memory device may cause tile selection signal 915-*a* to transition from the deselect voltage to the select voltage based on a command from a host device or a controller of the memory device. In some cases, the tile selection signal 915-*a* may be applied in like fashion to each word line driver 900 associated with the word line tile j.

Concurrent with causing tile selection signal 915-*a* to transition from the deselect voltage to the select voltage, the memory device may cause first tier selection signal 925-*a* to transition from a deselect voltage to a select voltage (e.g., from low to high voltage) based on a tier i that includes the respective word line plate for word line driver 900-*a* being selected for activation. For example, the memory device may cause first tier selection signal 925-*a* to transition from the deselect voltage to the select voltage based on a command from a host device or a controller of the memory device. In some cases, second tier selection signal 925-*b* may be complement of the first tier selection signal 925-*a* and thus may transition in complementary fashion (e.g., from high to low voltage) based on first tier selection signal 925-*a* transitioning from the deselect voltage to the select voltage. In some cases, the first tier selection signal 925-*a* and the second tier selection signal 925-*b* may be applied in like fashion to each word line driver 900 associated with the tier i, but only word line drivers 900 for which the corresponding word line tile is also selected may result in the corresponding word line plate signal 930-*a* transitioning to the activate state.

Tile selection signal 915-*a*, first tier selection signal 925-*a*, and second tier selection signal 925-*b* may set the respective transistors 905-*a* and 905-*b* in an on or off state in order to set word line plate signal 930-*a* (e.g., a signal for activating a word line plate at tier i within word line tile j) in an activate state when the respective word line plate is to be activated or to set word line plate signal 930-*a* in an inactive state when the respective word line plate is not to be activated. For example, when the word line plate is to be activated (e.g., to access one or more corresponding memory cells), a voltage difference between the first tier selection signal 925-*a* and the activate state of the word line plate signal 930-*a* may be greater than a threshold voltage of transistor 905-*a*, such that transistor 905-*a* may turn on, and a voltage difference between the second tier selection signal 925-*b* and the lower voltage supply 920 may be smaller than a threshold voltage of transistor 905-*b*, such that transistor 905-*b* may turn off (e.g., to reduce potential for a short to the lower voltage supply 920). Thus, based on tile selection signal 915-*a*, first tier selection signal 925-*a*, and second tier selection signal 925-*b* being in a particular combination of voltages, word line plate signal 930-*a* may transition to the activate state (e.g., high voltage) (e.g., tile selection signal 915-*a* may be transferred from the drain to the source of transistor 905-*a*).

When the word line plate is not being accessed, word line plate signal 930-*a* may be set to an inactive state (e.g., low voltage, such as a ground voltage). For example, a voltage difference between the first tier selection signal 925-*a* and word line plate signal 930-*a* may be less than the threshold voltage of transistor 905-*a*, and a voltage difference between second tier selection signal 925-*b* and the lower voltage supply 920 may be greater than the threshold voltage of transistor 905-*b*, such that transistor 905-*b* may turn on and transistor 905-*a* may turn off. Accordingly, tile selection signal 915-*a* may not be coupled with word line plate signal 930-*a*, and word line plate signal 930-*a* may transition to the voltage of the lower voltage supply 920 through transistor 905-*b*. Additionally or alternatively, the tile selection signal 915-*a* may transition to a deselect voltage (e.g., low voltage) to set word line plate signal 930-*a* in an inactive state.

FIG. 9B illustrates an example of a word line driver 900-*b* that may include a p-type transistor 910 (e.g., a positive metal oxide semiconductor (P-MOS) transistor) and an n-type transistor 905-*c* (e.g., such that word line driver 900-*b* may have an N+P-MOS structure). Word line driver 900-*b* may be operable to drive (e.g., select or activate) a respective word line plate using a word line plate signal 930-*b*, which may represent a word line plate signal as described with reference to FIG. 9A.

A source node of the transistor 910 may be configured to receive a first tile selection signal 915-*b* (e.g., a signal that may be referred to as a positive tile select signal), and a source node of transistor 905-*c* may be configured to receive a second tile selection signal 915-*c* (e.g., a signal that may be referred to as a negative tile select signal). A gate of the transistor 910 may be configured to receive a first tier selection signal 925-*c*, and a gate of transistor 905-*c* may be configured to receive a second tier selection signal 925-*d*. As illustrated by FIG. 9B, a drain node of the transistor 910 may be coupled with a drain node of transistor 905-*b*. The node at the drain of the transistor 910 and the drain of transistor 905-c may further be coupled with a respective word line plate (e.g., via an electrode, such as a staircase electrode described herein).

Word line driver 900-b may be associated with a word line plate of a stack of word line plates (e.g., located at any level or tier within the stack of word line plates) in a word line tile, as described herein. In order to activate the word line plate, a memory device may cause first tile selection signal 915-b to transition from a deselect voltage to a select voltage (e.g., from low to high voltage), second tile selection signal 915-c to transition from a deselect voltage to a select voltage (e.g., from high to low voltage), or both, based on a word line tile j that includes the respective word line plate for word line driver 900-b being selected for activation. For example, the memory device may cause such transitions based on a command from a host device or a controller of the memory device. In some cases, the first tile selection signal 915-b and the second tile selection signal 915-c may be applied in like fashion to each word line driver 900 associated with the word line tile j.

Concurrent with causing first tile selection signal 915-b to transition from the deselect voltage to the select voltage, second tile selection signal 915-c to transition from the deselect voltage to the select voltage, or both, the memory device may cause first tier selection signal 925-c (e.g., a signal that may be referred to as a positive tier select signal) and second tier selection signal 925-d (e.g., a signal that may be referred to as a negative tier select signal) to transition from a deselect voltage to a select voltage (e.g., from high to low voltage, such as to a voltage of the lower voltage supply 920) based on a tier i that includes the respective word line plate for word line driver 900-b being selected for activation. In some cases, the first tier selection signal 925-c and the second tier selection signal 925-d may be applied in like fashion to each word line driver 900 associated with the tier i, but only word line drivers 900 for which the corresponding word line tile is also selected may result in the corresponding word line plate signal 930-b transitioning to the activate state.

Positive tile selection signal 915-b, negative tile selection signal 915-c, positive tier selection signal 925-c, and negative tier selection signal 925-d may set the respective transistors 910 and 905-c in an on or off state in order to set word line plate signal 930-b (e.g., a signal for activating a word line plate at tier i in word line tile j) in an activate state when the respective word line plate is to be activated or to set word line plate signal 930-b in an inactive state when the respective word line plate is not to be activated. For example, when the word line plate is to be activated (e.g., to access one or more corresponding memory cells), a voltage difference between the first tier selection signal 925-c and the first tile selection signal 915-b may be greater than a threshold voltage of transistor 910, such that transistor 910-a may turn on, and a voltage difference between the second tier selection signal 925-d and the second tile selection signal 915-c may be smaller than a threshold voltage of transistor 905-c, such that transistor 905-c may turn off (e.g., to reduce potential for a short to the lower voltage supply 920). Thus, based on first tile selection signal 915-b, first tier selection signal 925-c, second tier selection signal 925-d, and second tile selection signal 915-c being in a particular combination of voltages, word line plate signal 930-b may transition to the activate state (e.g., high voltage) (e.g., first tile selection signal 915-b may be transferred from the drain to the drain of transistor 910).

When the word line plate is not being accessed, word line plate signal 930-b may be set to an inactive state (e.g., low voltage, such as a ground voltage). For example, a voltage difference between the first tier selection signal 925-c and first tile selection signal 915-b may be less than the threshold voltage of transistor 910, and a voltage difference between second tier selection signal 925-d and second tile selection signal 915-c may be greater than the threshold voltage of transistor 905-c, such that transistor 905-c may turn on and transistor 910 may turn off. Accordingly, first tile selection signal 915-b may not be coupled with word line plate signal 930-b, and word line plate signal 930-b may transition to the voltage of the lower voltage supply 920 through transistor 905-c. Additionally or alternatively, the first tile selection signal 915-b may transition to a deselect voltage (e.g., low voltage) to set word line plate signal 930-b in an inactive state.

Accordingly, word line decoding circuitry for driving word line plates of a memory array may include a set of word line drivers 900-a that may each include two n-type transistors 905, a set of word line drivers 900-b that may each include an n-type transistor 905 and a p-type transistor 910, or both. The word line drivers 900 may each activate one or more respective word line plates by applying a voltage (e.g., an activation bias, such as a word line plate signal 930 having an activation value) to the one or more word line plates based on tile selection and tier selection signals that are applied to the word line driver 900.

The size of each word line driver 900 (e.g., a transistor width) may be associated with a respective drive strength of the word line driver 900 (e.g., for driving the word line plate). Thus, the size of a word line driver 900 may be based on an amount of current and voltage that the driver 900 may apply to a corresponding word line plate, which may be based on dimensional and electrical qualities (e.g., capacitance) of the word line plate. For example, if the capacitance or resistivity of a word line plate increases, a driving capability of an associated word line driver 900 may be increase for driving the word line plate, which may result in an increased area (e.g., width) of the word line driver 900. In some examples, the width of the word line driver 900 may be based on a type of the transistor(s) of the word line driver 900. For example, a width of a n-type transistor 905 may be the same as or different from a width of a p-type transistor 910 for driving a corresponding word line plate.

Figure 10:
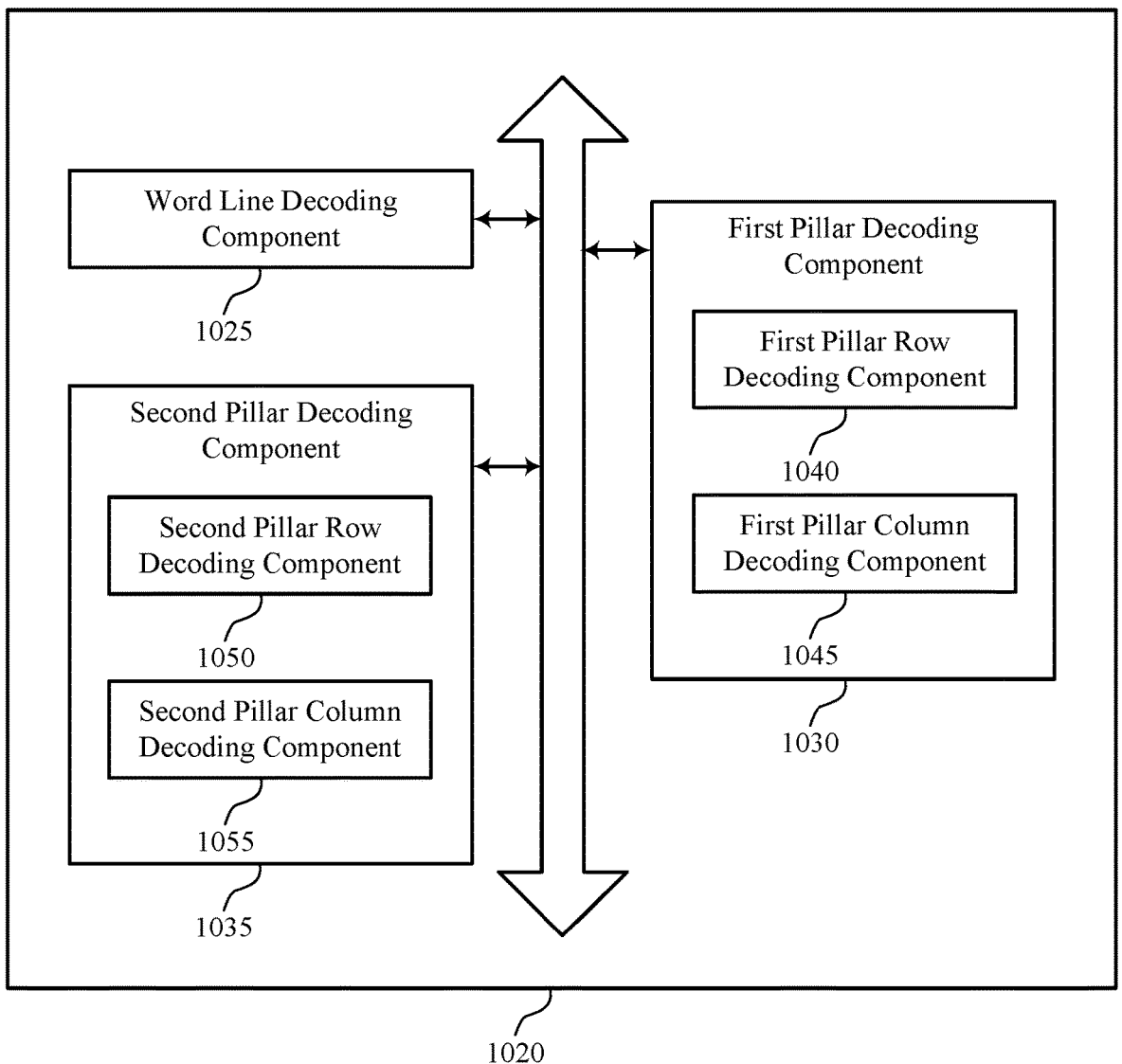
FIG. 10 shows a block diagram of a memory device that supports a decoding architecture for memory tiles in accordance with examples as disclosed herein.

FIG. 10 shows a block diagram 1000 of a memory device 1020 that supports decoding architecture for memory tiles in accordance with examples as disclosed herein. The memory device 1020 may be an example of aspects of a memory device as described with reference to FIGS. 1 through 9. The memory device 1020, or various components thereof, may be an example of means for performing various aspects of decoding architecture for memory tiles as described herein. For example, the memory device 1020 may include a word line decoding component 1025, a first pillar decoding component 1030, a second pillar decoding component 1035, a first pillar row decoding component 1040, a first pillar column decoding component 1045, a second pillar row decoding component 1050, a second pillar column decoding component 1055, or any combination thereof. Each of these components may communicate, directly or indirectly, with one another (e.g., via one or more buses).

The word line decoding component 1025 may be configured as or otherwise support a means for applying, using first decoding circuitry, a first voltage to a first word line plate of a first word line tile that is associated with a first pillar tile, the first word line plate including a set of first word lines each coupled with one or more respective memory cells of a set of first memory cells, where the first pillar tile includes a set of first pillars each coupled with one or more respective first memory cells of the set of first memory cells. In some examples, the word line decoding component 1025 may further be configured as or otherwise support a means for applying, using the first decoding circuitry, a second voltage to a second word line plate of a second word line tile that is associated with a second pillar tile, the second word line plate including a set of second word lines each coupled with one or more respective memory cells of a set of second memory cells, where the second pillar tile includes a set of second pillars each coupled with one or more respective second memory cells of the set of second memory cells.

The first pillar decoding component 1030 may be configured as or otherwise support a means for applying, using second decoding circuitry associated with the first pillar tile, a third voltage to a first pillar of the set of first pillars included in the first pillar tile, the first pillar coupled with a first memory cell of the set of first memory cells, where the first memory cell is operable to be accessed based on applying the first voltage to the first word line plate and applying the third voltage to the first pillar. The second pillar decoding component 1035 may be configured as or otherwise support a means for applying, using third decoding circuitry, a fourth voltage to a second pillar of the set of second pillars included in the second pillar tile, the second pillar coupled with a second memory cell of the set of second memory cells, where the second memory cell is operable to be accessed based on applying the second voltage to the second word line plate and applying the fourth voltage to the second pillar.

In some examples, the first decoding circuitry may be located below the set of first memory cells and the set of second memory cells, and the first decoding circuitry may be aligned with a respective edge of the first pillar tile and a respective edge of the second pillar tile.

In some examples, a third word line tile associated with the first pillar tile may include a third word line plate that includes a set of third word lines in a same plane as the set of first word lines, each third word line of the plurality of third word lines coupled with one or more respective memory cells of a plurality of third memory cells each coupled with a respective first pillar of the first pillar tile. The word line decoding component 1025 may further be configured as or otherwise support a means for concurrently applying the first voltage to the first word line plate and the third word line plate using the first decoding circuitry, where the first word line plate and the third word line plate share a word line driver included in or coupled with the first decoding circuitry.

In some examples, a fourth word line plate associated with the first pillar tile may be independently addressable from the first word line plate and include a set of fourth word lines in a same plane as the set of first word lines, each word line of the plurality of fourth word lines coupled with one or more respective memory cells of a plurality of fourth memory cells that are each coupled with a respective first pillar of the first pillar tile, where each fourth word line is located between a respective pair of first word lines. The word line decoding component 1025 may further be configured as or otherwise support a means for applying the first voltage to the fourth word line plate independently from the first word line plate using the first decoding circuitry, where the first word line plate and the fourth word line plate are coupled with different word line decoders of the first decoding circuitry.

In some examples, the first word line tile may include a set of first word line plates stacked in a vertical direction and including the first word line plate, where each first word line extends in a horizontal direction and each first pillar extends in the vertical direction. The word line decoding component 1025 may further be configured as or otherwise support a means for applying the first voltage to one of the set of first word line plates for a respective access operation.

In some examples, the second decoding circuitry may include a first pillar decoder and a second pillar decoder, and a first pillar row decoding component 1040 may be configured as or otherwise support a means for applying the third voltage to a pillar row line associated with the first pillar using the first pillar decoder. In some examples, the second decoding circuitry includes a first pillar decoder and a second pillar decoder, and a first pillar column decoding component 1045 may be configured as or otherwise support a means for applying a fifth voltage to a pillar column line associated with the first pillar using the second pillar decoder, where a pillar selector for the first pillar is operable to couple the first pillar with the pillar row line based on applying the fifth voltage to the pillar column line, and where applying the third voltage to the first pillar is based on coupling the first pillar with the pillar row line.

In some examples, the third decoding circuitry may include a third pillar decoder and a fourth pillar decoder, and a second pillar row decoding component 1050 may be configured as or otherwise support a means for applying the fourth voltage to a pillar row line associated with the second pillar using the third pillar decoder. In some examples, the third decoding circuitry includes a third pillar decoder and a fourth pillar decoder, and a second pillar column decoding component 1055 may be configured as or otherwise support a means for applying a fifth voltage to a pillar column line associated with the second pillar using the fourth pillar decoder, where a pillar selector for the second pillar is operable to couple the second pillar with the pillar row line based on applying the fifth voltage to the pillar column line, and where applying the fourth voltage to the second pillar is based on coupling the second pillar with the pillar row line.

FIG. 11 shows a flowchart illustrating a method 1100 that supports decoding architecture for memory tiles in accordance with examples as disclosed herein. The operations of method 1100 may be implemented by a memory device or its components as described herein. For example, the operations of method 1100 may be performed by a memory device as described with reference to FIGS. 1 through 10. In some examples, a memory device may execute a set of instructions to control the functional elements of the device to perform the described functions. Additionally or alternatively, the memory device may perform aspects of the described functions using special-purpose hardware.

At 1105, the method may include applying, using first decoding circuitry, a first voltage to a first word line plate of a first word line tile that is associated with a first pillar tile, the first word line plate including a set of first word lines each coupled with one or more respective memory cells of a set of first memory cells, where the first pillar tile includes a set of first pillars each coupled with one or more respective first memory cells of the set of first memory cells. The operations of 1105 may be performed in accordance with examples as disclosed herein. In some examples, aspects of the operations of 1105 may be performed by a word line decoding component 1025 as described with reference to FIG. 10.

At 1110, the method may include applying, using the first decoding circuitry, a second voltage to a second word line plate of a second word line tile that is associated with a second pillar tile, the second word line plate including a set of second word lines each coupled with one or more respective memory cells of a set of second memory cells, where the second pillar tile includes a set of second pillars each coupled with one or more respective second memory cells of the set of second memory cells. The operations of 1110 may be performed in accordance with examples as disclosed herein. In some examples, aspects of the operations of 1110 may be performed by a word line decoding component 1025 as described with reference to FIG. 10.

At 1115, the method may include applying, using second decoding circuitry associated with the first pillar tile, a third voltage to a first pillar of the set of first pillars included in the first pillar tile, the first pillar coupled with a first memory cell of the set of first memory cells, where the first memory cell is operable to be accessed based on applying the first voltage to the first word line plate and applying the third voltage to the first pillar. The operations of 1115 may be performed in accordance with examples as disclosed herein. In some examples, aspects of the operations of 1115 may be performed by a first pillar decoding component 1030 as described with reference to FIG. 10.

At 1120, the method may include applying, using third decoding circuitry, a fourth voltage to a second pillar of the set of second pillars included in the second pillar tile, the second pillar coupled with a second memory cell of the set of second memory cells, where the second memory cell is operable to be accessed based on applying the second voltage to the second word line plate and applying the fourth voltage to the second pillar. The operations of 1120 may be performed in accordance with examples as disclosed herein. In some examples, aspects of the operations of 1120 may be performed by a second pillar decoding component 1035 as described with reference to FIG. 10.

In some examples, an apparatus as described herein may perform a method or methods, such as the method 1100. The apparatus may include, features, circuitry, logic, means, or instructions (e.g., a non-transitory computer-readable medium storing instructions executable by a processor) for applying, using first decoding circuitry, a first voltage to a first word line plate of a first word line tile that is associated with a first pillar tile, the first word line plate including a set of first word lines each coupled with one or more respective memory cells of a set of first memory cells, where the first pillar tile includes a set of first pillars each coupled with one or more respective first memory cells of the set of first memory cells. The apparatus may further include, features, circuitry, logic, means, or instructions for applying, using the first decoding circuitry, a second voltage to a second word line plate of a second word line tile that is associated with a second pillar tile, the second word line plate including a set of second word lines each coupled with one or more respective memory cells of a set of second memory cells, where the second pillar tile includes a set of second pillars each coupled with one or more respective second memory cells of the set of second memory cells. The apparatus may further include, features, circuitry, logic, means, or instructions for applying, using second decoding circuitry associated with the first pillar tile, a third voltage to a first pillar of the set of first pillars included in the first pillar tile, the first pillar coupled with a first memory cell of the set of first memory cells, where the first memory cell is operable to be accessed based on applying the first voltage to the first word line plate and applying the third voltage to the first pillar. The apparatus may further include, features, circuitry, logic, means, or instructions for applying, using third decoding circuitry, a fourth voltage to a second pillar of the set of second pillars included in the second pillar tile, the second pillar coupled with a second memory cell of the set of second memory cells, where the second memory cell is operable to be accessed based on applying the second voltage to the second word line plate and applying the fourth voltage to the second pillar.

In some examples of the method 1100 and the apparatus described herein, the first decoding circuitry may be located below the set of first memory cells and the set of second memory cells, and the first decoding circuitry may be aligned with a respective edge of the first pillar tile and a respective edge of the second pillar tile.

In some examples of the method 1100 and the apparatus described herein, a third word line tile associated with the first pillar tile may include a third word line plate that includes a set of third word lines in a same plane as the set of first word lines, each third word line of the plurality of third word lines coupled with one or more respective memory cells of a plurality of third memory cells each coupled with a respective first pillar of the first pillar tile. The method, apparatuses, and non-transitory computer-readable medium may further include operations, features, circuitry, logic, means, or instructions for concurrently applying the first voltage to the first word line plate and the third word line plate using the first decoding circuitry, where the first word line plate and the third word line plate share a word line driver included in or coupled with the first decoding circuitry.

In some examples of the method 1100 and the apparatus described herein, a fourth word line plate associated with the first pillar tile may be independently addressable from the first word line plate and include a set of fourth word lines in a same plane as the set of first word lines, each word line of the plurality of fourth word lines coupled with one or more respective memory cells of a plurality of fourth memory cells that are each coupled with a respective first pillar of the first pillar tile, where each fourth word line is located between a respective pair of first word lines. The method, apparatuses, and non-transitory computer-readable medium may further include operations, features, circuitry, logic, means, or instructions for applying the first voltage to the fourth word line plate independently from the first word line plate using the first decoding circuitry, where the first word line plate and the fourth word line plate may be coupled with different word line decoders of the first decoding circuitry.

In some examples of the method 1100 and the apparatus described herein, the first word line tile may include a set of first word line plates stacked in a vertical direction and including the first word line plate, where each first word line extends in a horizontal direction and each first pillar extends in the vertical direction. The method, apparatuses, and non-transitory computer-readable medium may further include operations, features, circuitry, logic, means, or instructions for applying the first voltage to one of the set of first word line plates for a respective access operation.

In some examples of the method 1100 and the apparatus described herein, the second decoding circuitry may include a first pillar decoder and a second pillar decoder. The method, apparatuses, and non-transitory computer-readable medium may further include operations, features, circuitry, logic, means, or instructions for applying the third voltage to a pillar row line associated with the first pillar using the first pillar decoder and applying a fifth voltage to a pillar column line associated with the first pillar using the second pillar decoder, where a pillar selector for the first pillar may be operable to couple the first pillar with the pillar row line based on applying the fifth voltage to the pillar column line, and where applying the third voltage to the first pillar may be based on coupling the first pillar with the pillar row line.

In some examples of the method 1100 and the apparatus described herein, the third decoding circuitry may include a third pillar decoder and a fourth pillar decoder. The method, apparatuses, and non-transitory computer-readable medium may further include operations, features, circuitry, logic, means, or instructions for applying the fourth voltage to a pillar row line associated with the second pillar using the third pillar decoder and applying a fifth voltage to a pillar column line associated with the second pillar using the fourth pillar decoder, where a pillar selector for the second pillar may be operable to couple the second pillar with the pillar row line based on applying the fifth voltage to the pillar column line, and where applying the fourth voltage to the second pillar may be based on coupling the second pillar with the pillar row line.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a first word line tile including a first word line plate that includes a set of first word lines, each word line of the set of first word lines coupled with one or more respective memory cells of a set of first memory cells. The apparatus may further include a first pillar tile including a set of first pillars associated with the first word line tile, each first pillar coupled with one or more respective first memory cells of the set of first memory cells. The apparatus may further include a second word line tile including a second word line plate that includes a set of second word lines, each word line of the set of second word lines coupled with one or more respective memory cells of a set of second memory cells. The apparatus may further include a second pillar tile different than the first pillar tile, the second pillar tile including a set of second pillars each associated with the second word line tile and each coupled with one or more respective second memory cells of the set of second memory cells. The apparatus may further include first decoding circuitry associated with the first pillar tile and the second pillar tile, the first decoding circuitry operable to activate the set of first word lines included in the first word line plate associated with the first pillar tile and the set of second word lines included in the second word line plate associated with the second pillar tile.

In some examples, the first decoding circuitry may be located below the set of first memory cells and the set of second memory cells (e.g., between a substrate and the set of first memory cells and the set of second memory cells) and may be aligned with a respective edge of the first pillar tile and a respective edge of the second pillar tile.

In some examples, the apparatus may include a third word line tile including a third word line plate that includes a set of third word lines in a same plane as the set of first word lines, each word line of the set of third word lines coupled with one or more respective memory cells of a set of third memory cells that may be each coupled with a respective first pillar of the first pillar tile. The first decoding circuitry may be further operable to concurrently activate the set of first word lines of the first word line plate and the set of third word lines of the third word line plate.

In some examples, the first decoding circuitry may include or be coupled with a word line driver that may be coupled with the first word line plate and the third word line plate.

In some examples, the apparatus may include a fourth word line plate independently addressable from the first word line plate and including a set of fourth word lines in a same plane as the set of first word lines, each word line of the set of fourth word lines coupled with one or more respective memory cells of a set of fourth memory cells that may be each coupled with a respective first pillar of the first pillar tile, where each fourth word line may be located between a respective pair of first word lines.

In some examples, the first word line tile includes a set of first word line plates stacked in a vertical direction (e.g., orthogonal to a substrate) and including the first word line plate, each first word line extends in a horizontal direction (e.g., parallel to the substrate), and each first pillar extends in the vertical direction.

In some examples, the first decoding circuitry may be operable to activate one of the set of first word line plates for a respective access operation (e.g., an operation to access one or more memory cells coupled with the one activated first word line plate).

In some examples, the apparatus may include second decoding circuitry associated with the first pillar tile and operable to activate one or more first pillars of the set of first pillars. The second decoding circuitry may include two first subsets oriented in a first direction, the two first subsets nearer opposite edges of the first pillar tile. The second decoding circuitry may further include a second subset oriented in a second direction.

In some examples, the two first subsets may be operable to activate access lines that each extend in the second direction and may each be coupled with pillar selectors for a respective column of first pillars. The second subset may be operable to activate access lines that each extend in the first direction and may each be coupled with pillar selectors for a respective row of first pillars.

In some examples, the apparatus may include second decoding circuitry, where at least a subset of the second decoding circuitry may be associated with the first pillar tile and the second pillar tile. At least the subset of the second decoding circuitry may be operable to activate one or more first pillars of the set of first pillars and one or more second pillars of the set of second pillars.

In some examples, the apparatus may include second decoding circuitry associated with the first pillar tile and operable to activate one or more first pillars of the set of first pillars, the second decoding circuitry including a first pillar decoder and a second pillar decoder. The apparatus may further include a set of pillar column lines each associated with a respective column of first pillars and operable to be activated by the first pillar decoder, a set of pillar row lines each associated with a respective row of first pillars and operable to be activated by the second pillar decoder, and a set of pillar selectors. Each pillar selector may be operable to be activated by a respective pillar column line to couple a respective first pillar of the set of first pillars with a respective pillar row line of the set of pillar row lines.

In some examples, the apparatus may include a set of sense amplifiers located below the set of first memory cells and associated with the first pillar tile. The set of sense amplifiers may be operable to read one or more respective logic values from one or more of the set of first memory cells. In some examples, a quantity of the set of sense amplifiers may be equal to a quantity of the set of pillar row lines.

In some examples, one or both of the first pillar tile and the second pillar tile may have a first length in a first direction and a second length different than the first length in a second direction.

In some examples, the first decoding circuitry may include a set of word line drivers, each of the set of word line drivers including at least a respective n-type transistor and a respective p-type transistor.

In some examples, the first decoding circuitry may include a set of word line drivers, each of the set of word line drivers including two or more respective n-type transistors.

Another apparatus is described. The apparatus may include a first word line tile including a first word line plate that includes a set of first word lines, each word line of the set of first word lines coupled with one or more respective memory cells of a set of first memory cells. The apparatus may further include a first pillar tile including a set of first pillars associated with the first word line tile and each coupled with one or more respective first memory cells of the set of first memory cells. The apparatus may further include a second word line tile including a second word line plate that includes a set of second word lines, each word line of the set of second word lines coupled with one or more respective memory cells of a set of second memory cells. The apparatus may further include a second pillar tile including a set of second pillars associated with the second word line tile and each coupled with one or more respective second memory cells of the set of second memory cells. The apparatus may further include first decoding circuitry associated with the first word line tile and the second word line tile, second decoding circuitry associated with the first pillar tile, and third decoding circuitry associated with the second pillar tile. The apparatus may further include a controller operable to cause the apparatus to apply, using the first decoding circuitry, a first voltage to the first word line plate. The controller may be further operable to cause the apparatus to apply, using the first decoding circuitry, a second voltage to the second word line plate. The controller may be further operable to cause the apparatus to apply, using the second decoding circuitry, a third voltage to a first pillar of the set of first pillars included in the first pillar tile, the first pillar coupled with a first memory cell of the set of first memory cells, where the first memory cell is operable to be accessed based on applying the first voltage to the first word line plate and applying the third voltage to the first pillar. The controller may be further operable to cause the apparatus to apply, using the third decoding circuitry, a fourth voltage to a second pillar of the set of second pillars included in the second pillar tile, the second pillar coupled with a second memory cell of the set of second memory cells, where the second memory cell is operable to be accessed based on applying the second voltage to the second word line plate and applying the fourth voltage to the second pillar.

In some examples, the first decoding circuitry may be located below the set of first memory cells and the set of second memory cells (e.g., between a substrate and the set of first memory cells and the set of second memory cells), and the first decoding circuitry may be aligned with a respective edge of the first pillar tile and a respective edge of the second pillar tile.

In some examples, the apparatus may include a third word line tile including a third word line plate that includes a set of third word lines in a same plane as the set of first word lines, each third word line of the set of third word lines coupled with one or more respective memory cells of a set of third memory cells each coupled with a respective first pillar of the first pillar tile. In some examples, the controller may be further operable to cause the apparatus to concurrently apply the first voltage to the first word line plate and the third word line plate using the first decoding circuitry, where the first word line plate and the third word line plate may share a word line driver included in or coupled with the first decoding circuitry.

In some examples, the apparatus may include a fourth word line plate independently addressable from the first word line plate and including a set of fourth word lines in a same plane as the set of first word lines, each word line of the set of fourth word lines coupled with one or more respective memory cells of a set of fourth memory cells that may be each coupled with a respective first pillar of the first pillar tile, where each fourth word line may be located between a respective pair of first word lines. In some examples, the controller may be further operable to apply the first voltage to the fourth word line plate independently from the first word line plate using the first decoding circuitry, where the first word line plate and the fourth word line plate may be coupled with different word line decoders of the first decoding circuitry.

In some examples, the first word line tile may include a set of first word line plates stacked in a vertical direction (e.g., orthogonal to a substrate) and including the first word line plate, where each first word line extends in a horizontal direction (e.g., parallel to the substrate) and each first pillar extends in the vertical direction. In some examples, the controller may be further operable to apply the first voltage to one of the set of first word line plates for a respective access operation (e.g., an operation to access one or more memory cells coupled with the first word line plate to which the first voltage is applied).

In some examples, the second decoding circuitry may include a first pillar decoder and a second pillar decoder. The controller may be further operable to cause the apparatus to apply the third voltage to a pillar row line associated with the first pillar using the first pillar decoder and to apply a fifth voltage to a pillar column line associated with the first pillar using the second pillar decoder, where a pillar selector for the first pillar may be operable to couple the first pillar with the pillar row line based on applying the fifth voltage to the pillar column line, and where applying the third voltage to the first pillar may be based on coupling the first pillar with the pillar row line.

In some examples, the third decoding circuitry may include a third pillar decoder and a fourth pillar decoder. The controller may be further operable to cause the apparatus to apply the fourth voltage to a pillar row line associated with the second pillar using the third pillar decoder and apply a fifth voltage to a pillar column line associated with the second pillar using the fourth pillar decoder, where a pillar selector for the second pillar may be operable to couple the second pillar with the pillar row line based on applying the fifth voltage to the pillar column line, and where applying the fourth voltage to the second pillar may be based on coupling the second pillar with the pillar row line.

Another apparatus is described. The apparatus may include a first word line tile including a set of first word line plates stacked in a vertical direction, each first word line plate of the set of first word line plates including a respective set of first word lines each coupled with one or more respective memory cells of a set of first memory cells. The apparatus may further include a second word line tile including a set of second word line plates stacked in the vertical direction, each second word line plate of the set of second word line plates including a respective set of second word lines each coupled with one or more respective memory cells of a set of second memory cells, where each second word line plate is located in a same plane as a corresponding first word line plate. The apparatus may further include a first pillar tile including a set of first pillars associated with the first word line tile and the second word line tile, each first pillar coupled with a respective subset of first memory cells within the set of first memory cells or a respective subset of second memory cells within the set of second memory cells. The apparatus may further include a third word line tile including a set of third word line plates stacked in the vertical direction, each third word line plate of the set of third word line plates including a respective set of third word lines each coupled with one or more respective memory cells of a set of third memory cells, where each third word line plate is located in a same plane as a corresponding first word line plate. The apparatus may further include a second pillar tile including a set of second pillars associated with the third word line tile, each second pillar coupled with a respective subset of third memory cells of the set of third memory cells. The apparatus may further include first decoding circuitry associated with the first pillar tile and the second pillar tile, the first decoding circuitry located below the set of first memory cells, the set of second memory cells, and the set of third memory cells (e.g., between a substrate and the set of first memory cells, the set of second memory cells, and the set of third memory cells). The first decoding circuitry may be operable to activate a first word line plate of the set of first word line plates, a second word line plate of the set of second word line plates, and a third word line plate of the set of third word line plates, and the first decoding circuitry may be aligned with a respective edge of the first pillar tile and a respective edge of the second pillar tile.

In some examples, the first decoding circuitry may be further operable to concurrently activate the respective set of first word lines of the first word line plate and the respective set of second word lines of the second word line plate, where the first word line plate and the second word line plate share a word line driver included in or coupled with the first decoding circuitry.

In some examples, the apparatus may include a set of fourth word line plates independently addressable from the set of first word line plates and each located in a same plane as a corresponding first word line plate. Each fourth word line plate may include a respective set of fourth word lines each coupled with one or more respective memory cells of a set of fourth memory cells that may be each coupled with a respective first pillar of the first pillar tile, where each fourth word line may be located between a respective pair of first word lines.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a first word line tile comprising a first word line plate that includes a plurality of first word lines, each word line of the plurality of first word lines coupled with one or more respective memory cells of a plurality of first memory cells;
    a first pillar tile comprising a plurality of first pillars associated with the first word line tile, each first pillar coupled with one or more respective first memory cells of the plurality of first memory cells;
a second word line tile comprising a second word line plate that includes a plurality of second word lines, each word line of the plurality of second word lines coupled with one or more respective memory cells of a plurality of second memory cells;
a second pillar tile different than the first pillar tile, the second pillar tile comprising a plurality of second pillars each associated with the second word line tile and each coupled with one or more respective second memory cells of the plurality of second memory cells; and
first decoding circuitry associated with the first pillar tile and the second pillar tile, the first decoding circuitry operable to activate the plurality of first word lines included in the first word line plate associated with the first pillar tile and the plurality of second word lines included in the second word line plate associated with the second pillar tile.

2. The apparatus of claim 1, wherein the first decoding circuitry is located below the plurality of first memory cells and the plurality of second memory cells and is aligned with a respective edge of the first pillar tile and a respective edge of the second pillar tile.

3. The apparatus of claim 1, further comprising:
a third word line tile comprising a third word line plate that includes a plurality of third word lines in a same plane as the plurality of first word lines, each word line of the plurality of third word lines coupled with one or more respective memory cells of a plurality of third memory cells that are each coupled with a respective first pillar of the first pillar tile, wherein the first decoding circuitry is further operable to:
concurrently activate the plurality of first word lines of the first word line plate and the plurality of third word lines of the third word line plate.

4. The apparatus of claim 3, wherein the first decoding circuitry comprises or is coupled with a word line driver that is coupled with the first word line plate and the third word line plate.

5. The apparatus of claim 1, further comprising:
a fourth word line plate independently addressable from the first word line plate and including a plurality of fourth word lines in a same plane as the plurality of first word lines, each word line of the plurality of fourth word lines coupled with one or more respective memory cells of a plurality of fourth memory cells that are each coupled with a respective first pillar of the first pillar tile, wherein each fourth word line is located between a respective pair of first word lines.

6. The apparatus of claim 1, wherein the first word line tile comprises a plurality of first word line plates stacked in a vertical direction and including the first word line plate, and wherein each first word line extends in a horizontal direction and each first pillar extends in the vertical direction.

7. The apparatus of claim 6, wherein the first decoding circuitry is operable to activate one of the plurality of first word line plates for a respective access operation.

8. The apparatus of claim 1, further comprising:
second decoding circuitry associated with the first pillar tile and operable to activate one or more first pillars of the plurality of first pillars, the second decoding circuitry comprising:
two first subsets oriented in a first direction, the two first subsets nearer opposite respective edges of the first pillar tile; and
a second subset oriented in a second direction.

9. The apparatus of claim 8, wherein:
the two first subsets are operable to activate access lines that each extend in the second direction and are each coupled with pillar selectors for a respective column of first pillars; and
the second subset is operable to activate access lines that each extend in the first direction and are each coupled with pillar selectors for a respective row of first pillars.

10. The apparatus of claim 1, further comprising:
second decoding circuitry, wherein at least a subset of the second decoding circuitry is associated with the first pillar tile and the second pillar tile, and wherein at least the subset of the second decoding circuitry is operable to activate one or more first pillars of the plurality of first pillars and one or more second pillars of the plurality of second pillars.

11. The apparatus of claim 1, further comprising:
second decoding circuitry associated with the first pillar tile and operable to activate one or more first pillars of the plurality of first pillars, the second decoding circuitry comprising a first pillar decoder and a second pillar decoder;
a plurality of pillar column lines each associated with a respective column of first pillars and operable to be activated by the first pillar decoder;
a plurality of pillar row lines each associated with a respective row of first pillars and operable to be activated by the second pillar decoder; and
a plurality of pillar selectors, each pillar selector operable to be activated by a respective pillar column line to couple a respective first pillar of the plurality of first pillars with a respective pillar row line of the plurality of pillar row lines.

12. The apparatus of claim 11, further comprising:
a plurality of sense amplifiers located below the plurality of first memory cells and associated with the first pillar tile, the plurality of sense amplifiers operable to read one or more respective logic values from one or more of the plurality of first memory cells, wherein a quantity of the plurality of sense amplifiers is equal to a quantity of the plurality of pillar row lines.

13. The apparatus of claim 1, wherein the first pillar tile and the second pillar tile have a first length in a first direction and a second length different than the first length in a second direction.

14. The apparatus of claim 1, wherein the first decoding circuitry comprises a plurality of word line drivers, each of the plurality of word line drivers comprising a respective n-type transistor and a respective p-type transistor.

15. The apparatus of claim 1, wherein the first decoding circuitry comprises a plurality of word line drivers, each of the plurality of word line drivers comprising two or more respective n-type transistors.

16. An apparatus, comprising:
a first word line tile comprising a first word line plate that includes a plurality of first word lines, each word line of the plurality of first word lines coupled with one or more respective memory cells of a plurality of first memory cells;
a first pillar tile comprising a plurality of first pillars associated with the first word line tile and each coupled with one or more respective first memory cells of the plurality of first memory cells;
a second word line tile comprising a second word line plate that includes a plurality of second word lines, each word line of the plurality of second word lines coupled with one or more respective memory cells of a plurality of second memory cells;
a second pillar tile comprising a plurality of second pillars associated with the second word line tile and each coupled with one or more respective second memory cells of the plurality of second memory cells;
first decoding circuitry associated with the first word line tile and the second word line tile;
second decoding circuitry associated with the first pillar tile;
third decoding circuitry associated with the second pillar tile; and
a controller operable to cause the apparatus to:
  apply, using the first decoding circuitry, a first voltage to the first word line plate;
  apply, using the first decoding circuitry, a second voltage to the second word line plate;
  apply, using the second decoding circuitry, a third voltage to a first pillar of the plurality of first pillars included in the first pillar tile, the first pillar coupled with a first memory cell of the plurality of first memory cells, wherein the first memory cell is operable to be accessed based at least in part on applying the first voltage to the first word line plate and applying the third voltage to the first pillar; and
  apply, using the third decoding circuitry, a fourth voltage to a second pillar of the plurality of second pillars included in the second pillar tile, the second pillar coupled with a second memory cell of the plurality of second memory cells, wherein the second memory cell is operable to be accessed based at least in part on applying the second voltage to the second word line plate and applying the fourth voltage to the second pillar.

17. The apparatus of claim 16, wherein the first decoding circuitry is located below the plurality of first memory cells and the plurality of second memory cells, and wherein the first decoding circuitry is aligned with a respective edge of the first pillar tile and a respective edge of the second pillar tile.

18. The apparatus of claim 16, further comprising:
a third word line tile comprising a third word line plate that includes a plurality of third word lines in a same plane as the plurality of first word lines, each third word line of the plurality of third word lines coupled with one or more respective memory cells of a plurality of third memory cells each coupled with a respective first pillar of the first pillar tile, wherein the controller is further operable to cause the apparatus to:
  concurrently apply the first voltage to the first word line plate and the third word line plate using the first decoding circuitry, wherein the first word line plate and the third word line plate share a word line driver included in or coupled with the first decoding circuitry.

19. The apparatus of claim 16, further comprising:
a fourth word line plate independently addressable from the first word line plate and including a plurality of fourth word lines in a same plane as the plurality of first word lines, each word line of the plurality of fourth word lines coupled with one or more respective memory cells of a plurality of fourth memory cells that are each coupled with a respective first pillar of the first pillar tile, wherein each fourth word line is located between a respective pair of first word lines, and wherein the controller is further operable to cause the apparatus to:
  apply the first voltage to the fourth word line plate independently from the first word line plate using the first decoding circuitry, wherein the first word line plate and the fourth word line plate are coupled with different word line decoders of the first decoding circuitry.

20. The apparatus of claim 16, wherein the first word line tile comprises a plurality of first word line plates stacked in a vertical direction and including the first word line plate, wherein each first word line extends in a horizontal direction and each first pillar extends in the vertical direction, and wherein the controller is further operable to cause the apparatus to:
  apply the first voltage to one of the plurality of first word line plates for a respective access operation.

21. The apparatus of claim 16, wherein the second decoding circuitry comprises a first pillar decoder and a second pillar decoder, the controller further operable to cause the apparatus to:
  apply the third voltage to a pillar row line associated with the first pillar using the first pillar decoder; and
  apply a fifth voltage to a pillar column line associated with the first pillar using the second pillar decoder, wherein a pillar selector for the first pillar is operable to couple the first pillar with the pillar row line based at least in part on applying the fifth voltage to the pillar column line, and wherein applying the third voltage to the first pillar is based at least in part on coupling the first pillar with the pillar row line.

22. The apparatus of claim 16, wherein the third decoding circuitry comprises a third pillar decoder and a fourth pillar decoder, the controller further operable to cause the apparatus to:
  apply the fourth voltage to a pillar row line associated with the second pillar using the third pillar decoder; and
  apply a fifth voltage to a pillar column line associated with the second pillar using the fourth pillar decoder, wherein a pillar selector for the second pillar is operable to couple the second pillar with the pillar row line based at least in part on applying the fifth voltage to the pillar column line, and wherein applying the fourth voltage to the second pillar is based at least in part on coupling the second pillar with the pillar row line.

23. An apparatus, comprising:
a first word line tile comprising a plurality of first word line plates stacked in a vertical direction, each first word line plate of the plurality of first word line plates including a respective plurality of first word lines each coupled with one or more respective memory cells of a plurality of first memory cells;
a second word line tile comprising a plurality of second word line plates stacked in the vertical direction, each second word line plate of the plurality of second word line plates including a respective plurality of second word lines each coupled with one or more respective memory cells of a plurality of second memory cells, wherein each second word line plate is located in a same plane as a corresponding first word line plate;
a first pillar tile comprising a plurality of first pillars associated with the first word line tile and the second word line tile, each first pillar coupled with a respective subset of first memory cells within the plurality of first memory cells or a respective subset of second memory cells within the plurality of second memory cells;
a third word line tile comprising a plurality of third word line plates stacked in the vertical direction, each third word line plate of the plurality of third word line plates including a respective plurality of third word lines each coupled with one or more respective memory cells of a plurality of third memory cells, wherein each third word line plate is located in a same plane as a corresponding first word line plate;

a second pillar tile comprising a plurality of second pillars associated with the third word line tile, each second pillar coupled with a respective subset of third memory cells of the plurality of third memory cells; and first decoding circuitry associated with the first pillar tile and the second pillar tile, the first decoding circuitry located below the plurality of first memory cells, the plurality of second memory cells, and the plurality of third memory cells, wherein the first decoding circuitry is operable to activate a first word line plate of the plurality of first word line plates, a second word line plate of the plurality of second word line plates, and a third word line plate of the plurality of third word line plates, and wherein the first decoding circuitry is aligned with a respective edge of the first pillar tile and a respective edge of the second pillar tile.

24. The apparatus of claim 23, wherein the first decoding circuitry is further operable to:
concurrently activate the respective plurality of first word lines of the first word line plate and the respective plurality of second word lines of the second word line plate, wherein the first word line plate and the second word line plate share a word line driver included in or coupled with the first decoding circuitry.

25. The apparatus of claim 23, further comprising:
a plurality of fourth word line plates independently addressable from the plurality of first word line plates and each located in a same plane as a corresponding first word line plate, each fourth word line plate including a respective plurality of fourth word lines each coupled with one or more respective memory cells of a plurality of fourth memory cells that are each coupled with a respective first pillar of the first pillar tile, wherein each fourth word line is located between a respective pair of first word lines.

* * * * *